United States Patent
Chan et al.

(10) Patent No.: US 8,568,867 B2
(45) Date of Patent: *Oct. 29, 2013

(54) POLYIMIDE SOLVENT CAST FILMS HAVING A LOW COEFFICIENT OF THERMAL EXPANSION AND METHOD OF MANUFACTURE THEREOF

(75) Inventors: Kwok Pong Chan, Troy, NY (US); Erik Hagberg, Evansville, IN (US); Tara J. Mullen, Mt. Vernon, IN (US); Roy Ray Odle, Mt. Vernon, IN (US)

(73) Assignee: Sabic Innovative Plastics IP B.V. (NL)

( * ) Notice: Subject to any disclaimer, the term of this patent is extended or adjusted under 35 U.S.C. 154(b) by 1157 days.

This patent is subject to a terminal disclaimer.

(21) Appl. No.: 11/758,796

(22) Filed: Jun. 6, 2007

(65) Prior Publication Data
US 2008/0044683 A1     Feb. 21, 2008

Related U.S. Application Data

(60) Provisional application No. 60/805,821, filed on Jun. 26, 2006.

(51) Int. Cl.
*B32B 5/16* (2006.01)
*B32B 15/08* (2006.01)
*B32B 27/28* (2006.01)

(52) U.S. Cl.
USPC ......... 428/323; 428/457; 428/458; 428/473.5

(58) Field of Classification Search
None
See application file for complete search history.

(56) References Cited

U.S. PATENT DOCUMENTS

| | | |
|---|---|---|
| 3,383,092 A | 5/1968 | Cazier |
| 3,671,487 A | 6/1972 | Abolins |
| 3,723,373 A | 3/1973 | Lucas |
| 3,803,085 A | 4/1974 | Takehoshi et al. |
| 3,847,867 A | 11/1974 | Heath et al. |
| 3,850,885 A | 11/1974 | Takekoshi et al. |
| 3,852,242 A | 12/1974 | White |
| 3,855,178 A | 12/1974 | White et al. |
| 3,905,942 A | 9/1975 | Takekoshi et al. |
| 3,972,902 A | 8/1976 | Heath et al. |
| 3,983,093 A | 9/1976 | Williams, III et al. |
| 4,115,341 A | 9/1978 | Boldebuck et al. |
| 4,157,996 A | 6/1979 | Boldebuck et al. |
| 4,247,443 A | 1/1981 | Sasaki et al. |
| 4,307,226 A | 12/1981 | Bolon et al. |
| 4,360,633 A | 11/1982 | Bolon et al. |
| 4,374,972 A | 2/1983 | Bolon et al. |
| 4,412,018 A | 10/1983 | Finlayson et al. |
| 4,443,591 A | 4/1984 | Schmidt et al. |
| 4,455,410 A | 6/1984 | Giles, Jr. |
| 4,535,105 A | 8/1985 | Inaike et al. |
| 4,558,117 A | 12/1985 | Nakano et al. |
| 4,568,715 A | 2/1986 | Itatani et al. |
| 4,595,548 A | 6/1986 | St. Clair et al. |
| 4,603,061 A | 7/1986 | St. Clair et al. |
| 4,696,994 A | 9/1987 | Nakajima et al. |
| 4,725,484 A | 2/1988 | Kumagawa et al. |
| 4,778,872 A | 10/1988 | Sasaki et al. |
| 4,794,157 A | 12/1988 | Berdahl et al. |
| 4,870,194 A | 9/1989 | Molinaro et al. |
| 4,910,288 A | 3/1990 | Dellacoletta |
| 4,957,801 A | 9/1990 | Maranci et al. |
| 5,021,168 A | 6/1991 | Molinaro et al. |
| 5,077,382 A | 12/1991 | Meterko et al. |
| 5,128,444 A | 7/1992 | Inoue et al. |
| 5,147,966 A | 9/1992 | St. Clair et al. |
| 5,164,460 A | 11/1992 | Yano et al. |
| 5,171,828 A | 12/1992 | Meterko et al. |
| 5,212,283 A | 5/1993 | St. Clair |
| 5,229,482 A | 7/1993 | Brunelle |
| 5,260,407 A | 11/1993 | Saruwatari et al. |
| 5,262,516 A | 11/1993 | Dellacoletta |
| 5,298,331 A | 3/1994 | Kanakarajan et al. |
| 5,302,652 A | 4/1994 | Parish |
| 5,338,826 A | 8/1994 | St. Clair et al. |
| 5,374,740 A | 12/1994 | Elbl-Weiser et al. |
| 5,426,071 A | 6/1995 | Summers |
| 5,442,031 A | 8/1995 | Dunlap |
| 5,460,890 A | 10/1995 | Okahashi et al. |
| 5,478,915 A | 12/1995 | Amone et al. |
| 5,707,439 A | 1/1998 | Takekoshi et al. |
| 5,731,404 A | 3/1998 | Auman et al. |
| 5,744,575 A | 4/1998 | Nakanishi et al. |
| 5,807,629 A | 9/1998 | Elspass et al. |

(Continued)

FOREIGN PATENT DOCUMENTS

| | | |
|---|---|---|
| EP | 0095174 A2 | 11/1983 |
| EP | 0178079 A1 | 4/1986 |

(Continued)

OTHER PUBLICATIONS

Park, Cheol et al., "Polyimide/silica Hybrid-Clay Nanocomposites" Polymer vol. 46, No. 23 (Nov. 14, 2005) pp. 9694-9701, Elsevier Science Publishers, B.V.

(Continued)

*Primary Examiner* — Monique Jackson

(74) *Attorney, Agent, or Firm* — Cantor Colburn LLP; Diderico van Eyl

(57) ABSTRACT

A solvent cast film comprises a polyimide comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, with a diamine component comprising 4,4'-diaminodiphenylsulfone; wherein the polyimide has a glass transition temperature from 190° C. to 400° C.; and wherein the film has a coefficient of thermal expansion of less than 60 ppm/° C., a thickness from 0.1 to 250 micrometers, and less than 5% residual solvent by weight.

47 Claims, 1 Drawing Sheet

(56) References Cited

U.S. PATENT DOCUMENTS

| | | | |
|---|---|---|---|
| 5,830,564 A | 11/1998 | Kohno et al. | |
| 5,849,397 A | 12/1998 | Kohno et al. | |
| 5,889,139 A * | 3/1999 | Fay et al. | 528/353 |
| 5,891,986 A | 4/1999 | Yamaguchi et al. | |
| 6,028,203 A | 2/2000 | Brunelle et al. | |
| 6,057,035 A | 5/2000 | Singh et al. | |
| 6,117,932 A | 9/2000 | Hasegawa et al. | |
| 6,143,399 A | 11/2000 | Kohno et al. | |
| 6,162,857 A | 12/2000 | Trexler, Jr. et al. | |
| 6,217,996 B1 | 4/2001 | Yamamoto et al. | |
| 6,232,388 B1 | 5/2001 | Lan et al. | |
| 6,251,980 B1 | 6/2001 | Lan et al. | |
| 6,281,323 B1 | 8/2001 | Yokota et al. | |
| 6,335,416 B1 | 1/2002 | Nojiri et al. | |
| 6,342,638 B1 * | 1/2002 | Yoon et al. | 568/14 |
| 6,384,121 B1 | 5/2002 | Barbee et al. | |
| 6,387,996 B1 | 5/2002 | Lan et al. | |
| 6,410,142 B1 | 6/2002 | Chen et al. | |
| 6,545,121 B1 | 4/2003 | Matsubara et al. | |
| 6,548,180 B2 | 4/2003 | Yamamoto et al. | |
| 6,579,927 B1 | 6/2003 | Fischer | |
| 6,653,388 B1 | 11/2003 | Barbee et al. | |
| 6,808,818 B2 | 10/2004 | Ozawa et al. | |
| 6,838,184 B2 | 1/2005 | Takahashi et al. | |
| 6,906,127 B2 | 6/2005 | Liang et al. | |
| 2004/0010062 A1 | 1/2004 | Ahn et al. | |
| 2004/0127627 A1 | 7/2004 | Gilmer et al. | |
| 2004/0132900 A1 | 7/2004 | Sachdev et al. | |
| 2005/0070684 A1 * | 3/2005 | Gallucci et al. | 528/170 |
| 2005/0234219 A1 | 10/2005 | Silvi et al. | |
| 2005/0272847 A1 | 12/2005 | Wang et al. | |
| 2006/0115670 A1 * | 6/2006 | Tanaka et al. | 428/615 |
| 2006/0281840 A1 * | 12/2006 | Gallucci et al. | 524/115 |
| 2007/0106005 A1 * | 5/2007 | Bourgeois | 524/445 |
| 2007/0123682 A1 | 5/2007 | Raj et al. | |
| 2007/0299186 A1 | 12/2007 | Chan et al. | |
| 2007/0299187 A1 | 12/2007 | Chan et al. | |
| 2007/0299188 A1 | 12/2007 | Chan et al. | |
| 2007/0299189 A1 | 12/2007 | Cao et al. | |
| 2008/0004391 A1 | 1/2008 | Chan et al. | |
| 2008/0015330 A1 | 1/2008 | Chan et al. | |
| 2008/0021175 A1 | 1/2008 | Chan et al. | |
| 2008/0044639 A1 | 2/2008 | Chan et al. | |
| 2008/0044682 A1 | 2/2008 | Chan et al. | |
| 2008/0044684 A1 | 2/2008 | Chan et al. | |
| 2009/0043024 A1 | 2/2009 | Brunelle et al. | |

FOREIGN PATENT DOCUMENTS

| | | |
|---|---|---|
| EP | 0459472 A1 | 12/1991 |
| EP | 0659553 | 6/1995 |
| EP | 1350815 A1 | 10/2003 |
| EP | 1473328 A1 | 11/2004 |
| JP | 03215581 | 9/1991 |
| JP | 05279495 | 10/1993 |
| JP | 05320379 | 12/1993 |
| JP | 05271410 | 10/1996 |
| JP | 10088078 | 4/1998 |
| JP | 11209608 | 8/1999 |
| JP | 2000159887 | 6/2000 |
| JP | 2000136253 | 5/2001 |
| JP | 2001270736 | 10/2001 |
| JP | 2001302913 | 10/2001 |
| JP | 2002322276 | 11/2002 |
| JP | 2003176354 | 6/2003 |
| JP | 2005298751 A | 10/2005 |
| WO | 0078540 A1 | 12/2000 |
| WO | 2005028363 A2 | 3/2005 |

OTHER PUBLICATIONS

International Search Report for PCT/US2007/072019 (Reference No. 218733-14) International Filing Date Jun. 25, 2007, Mailing Date Aug. 1, 2008 (6 pages).

Written Opinion of the International Searching Authority for PCT/US2007/072019 (Reference No. 218733-14) International Filing Date Jun. 25, 2007, Mailing Date Aug. 1, 2008 (9 pages).

Japanese Patent No. 2005298751; Date of Publication: Oct. 27, 2005; Abstract Only; 1 Page.

Chen et al.; "Synthesis of Disordered and Highly Exfoliated Epoxy/Clay Nanocomposites Using Organoclay with Catalytic Function via Acetone—Clay Slurry Method"; Chem. Matter; vol. 16 (2004); pp. 4864-4866.

Dasart et al.; "Clay Exfoliation and Organic Modification on Wear of Nylon 6 Nanocomposites Processed by Different Routes"; Composites Science and Technology; vol. 65 (2005); pp. 2314-2328.

Guillaumel et al.; "Synthesis and Biological Activity of 5H-isoindolo[2,1-a] indol-6-ones, Analogues of Batracylin, and Related Compounds"; European Journal of Medicinal Chemistry; vol. 41 (2006); pp. 379-386.

Hasegawa et al.; "Nylon 6/Na-montmorillonite Nanocomposites Prepared by Compounding Nylon 6 with Na-montmorillonite Slurry"; Polymer; vol. 44 (2003); pp. 2933-2937.

Jeon et al.; "Characterization of Polyisoprene-Clay Nanocomposites Prepared by Solution Blending"; Polymer; vol. 44 (2003); pp. 5749-5758.

Kato et al.; "Development of New Production Method for a Polypropylene-Clay Nanocomposite"; Polymer Engineering and Science; vol. 44, No. 7 (Jul. 2004); pp. 1205-1211.

Katritzky et al.; "Polymers by the Reaction of Bis(pyrylium Salts) with Diamines: A Novel Approach to Ionene Polymers"; Journal of Polymer Science, Part A: Polymer Chemistry; vol. 26 (1988); pp. 3323-3336.

Laine et al.; "Conformationally Gated Photoinduced Processes within Photosensitizer—Acceptor Dyads Based on Osmium(Ii) Complexes with Triarylpyridinio-Functionalized Terpyridyl Ligands: Insights from Experimental Study"; J. Am. Chem. Soc.; vol. 128 (2006); pp. 7510-7521.

Lam et al.; "Effect of Ultrasound Sonication in Nanoclay Clusters of Nanoclay/Epoxy Composites"; Materials Letters; vol. 59 (2005); pp. 1369-1372.

Lee et al.; "Exfoliation and Dispersion Enhancement in Polypropylene Nanocomposites by In-Situ Melt Phase Ultrasonication"; Polymer Engineering and Science; vol. 44, No. 9 (Sep. 2004); pp. 1773-1782.

Lertwimolnum et al.; "Influence of Compatibilizer and Processing Conditions on the Dispersion of Nanoclay in a Polypropylene Matrix"; Polymer; vol. 46 (2005); pp. 3462-3471.

Makowski et al.; "Characterization of Rigid Rod Poly(pyridinium salt)s by Conformational Analysis, Molecular Dynamics, and Steady-State and Time Resolved Fluorescence"; Polymer; vol. 34, No. 8 (1993); pp. 1606-1612.

Morgan et al.; "Characterization of the Dispersion of Clay in a Polyetherimide Nanocomposite"; Macromolecules; vol. 34 (2001); pp. 2735-2738.

Morgan et al.; "Exfoliated Polystyrene-Clay Nanocomposites Synthesized by Solvent Blending wtih Sonication"; Polymer; vol. 45 (2004); pp. 8695-8703.

Moy et al.; "Synthesis of Hydroxyl-Containing Polyimides Derived from 4,6-Diamino-resorcinol Dihydrochloride and Aromatic Tetracarboxylic Dianhydrides"; Journal of Polymer Science, Part A: Polymer Chemistry; vol. 32 (1994); pp. 1903-1908.

Panek et al.; "Heterogeneity of the Surfactant Layer in Organically Modified Silicates and Polymer/Layered Silicate Composites"; Macromolecules; vol. 39 (2006); pp. 2191-2200.

Park et al.; "Adverse Effects of Thermal Dissociation of Alkyl Ammonium Ions on Nanoclay Exfoliation in Epoxy-Clay Systems"; Polymer; vol. 45 (2004); pp. 7673-7679.

Park et al.; "Mechanism of Exfoliation of Nanoclay Particles in Epoxy-Clay Nanocomposites"; Macromolecules; vol. 36 (2003); pp. 2758-2768.

Paul et al.; "(Plasticized) Polylactide/(Organo-)Clay Nanocomposites by in situ Intercalative Polymerization"; Macromol. Chem. Phys.; vol. 206 (2005); pp. 484-498.

STIC Structure Search 11766227-342596—EICSEARCH.pdf; Submitted Sep. 13, 2010; Received Sep. 22, 2010.

(56) References Cited

OTHER PUBLICATIONS

STIC Structure Search 11766227—Search.pdf; Submitted May 20, 2010; Received Jun. 4, 2010.

Sun et al.; "Synthesis and Properties of Ionic, Rigid-Rod, and Thermally Stable Polyimides Containing Bipyridinium Triflates"; Macromolecules; vol. 31, No. 13 (1998); pp. 4291-4296.

Takekoshi et al.; "Polyetherimides. I. Preparation of Dianhydrides Containing Aromatic Ether Groups"; Journal of Polymer Science: Polymer Chemistry Edition; vol. 23 (1985); pp. 1759-1769.

Tigelaar et al.; "Synthesis and Characterization of Poly(pyridinium triflate)s with Alkyl and Aromatic Spacer Groups for Potential Use as Nonlinear Optic Materials"; High Performance Polymers; vol. 17 (2005); pp. 515-531.

Ton-That et al.; "Polyolefin Nanocomposites: Formulation and Development"; Polymer Engineering and Science; vol. 44, No. 7 (Jul. 2004); pp. 1212-1219.

U.S. Appl. No. 11/766,238, filed Jun. 21, 2007; "Compositions and Methods for Polymer Composites".

U.S. Appl. No. 11/766,274, filed Jun. 21, 2007; "Compositions and Methods for Polymer Composites".

U.S. Appl. No. 11/766,300, filed Jun. 21, 2007; "Compositions and Methods for Polymer Composites".

U.S. Appl. No. 11/766,355, filed Jun. 21, 2007; "Compositions and Methods for Polymer Composites".

U.S. Appl. No. 11/766,843, filed Jun. 21, 2007; "Compositions and Methods for Polymer Composites".

Wang et al.; "Preparation of Highly Exfoliated Epoxy/Clay Nanocomposites by "Slurry Compounding": Process and Mechanisms"; Langmuir; vol. 21, No. 8 (2005); pp. 3613-3618.

Wang et al.; "Sonochemical One-Directional Growth of Montmorillonite-Polystyrene Nanocomposite"; Ultrasonics Sonochemistry; vol. 12 (2005); pp. 165-168.

Zhong et al.; "Synthesis and Rheological Properties of Polystyrene/ Layered Silicate Nanocomposite"; Polymer; vol. 46 (2005); pp. 3006-3013.

Zhu et al.; "Effects of Process Conditions and Mixing Protocols on Structure of Extruded Polypropylene Nanocomposites"; Journal of Applied Polymer Science; vol. 93 (2004); pp. 1891-1899.

Burgentzle et al.; "Solvent-Based Nanocomposite Coatings I. Dispersion of Organophilic Montmorillonite in Organic Solvents"; Journal of Colloid and Interface Science; vol. 278 (2004); pp. 26-39.

Chang et al.; "Preparation and Characterization of Polyimide Nanocomposites with Different Organo-Montmorillonites"; Polymer Engineering and Science; vol. 41, No. 9 (Sep. 2001); pp. 1514-1520.

Abstract of JP2004189981(A); Published Jul. 8, 2004; 2 pages.

Ma et al.; "A New Approach to Polymer/Montmorillonite Nanocomposites"; Polymer; vol. 44 (2004); pp. 4619-4624.

Perez-Maqueda et al.; "The Influence of Sonication on the Thermal Behavior of Muscovite and Biotite"; Journal of the European Ceramic Society; vol. 24 (2004); pp. 2793-2801.

Yu et al.; "Water-Assisted Melt Compounding of Nylon-6/Pristine Montmorillonite Nanocomposites"; Journal of Polymer Science: Part B: Polymer Physics; vol. 43 (2005); pp. 1100-1112.

\* cited by examiner

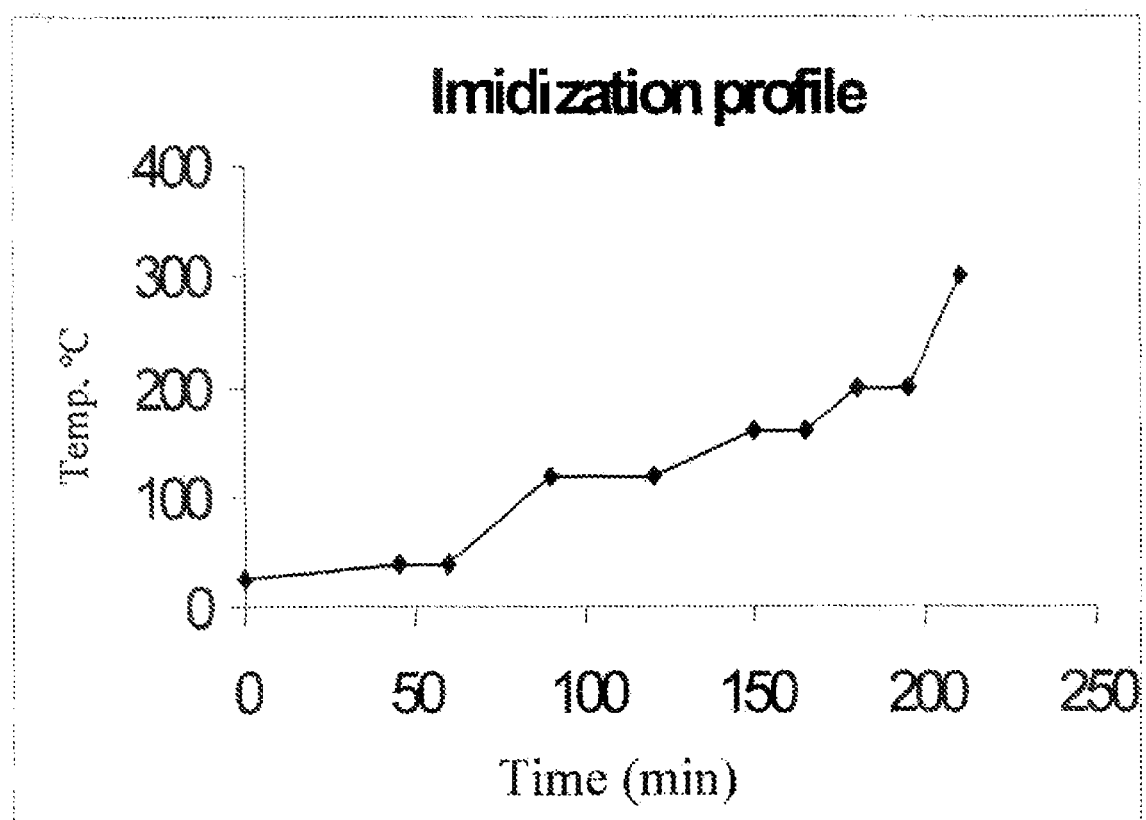

POLYIMIDE SOLVENT CAST FILMS HAVING A LOW COEFFICIENT OF THERMAL EXPANSION AND METHOD OF MANUFACTURE THEREOF

CROSS REFERENCE TO RELATED APPLICATION

This application claims priority to copending U.S. Provisional Application Ser. No. 60/805,821, filed Jun. 26, 2006, which is incorporated herein by reference in its entirety.

FIELD OF THE INVENTION

The present invention is directed to a solvent cast film comprising a polyimide and methods for the manufacture of such films. The film is formed by polymerization of a dianhydride component and a diamine component, and has a Tg of between 180° C. and 450° C., specifically 190° C. or greater, and wherein the film has: a) a CTE of less than 70 ppm/° C., specifically less than 60 ppm/° C.; b) a thickness of between 0.1 micrometers and 250 micrometers, specifically 5 to 250 micrometers; and, c) contains less than 5% residual solvent by weight.

BACKGROUND OF THE INVENTION

Thermoplastic sheets and films have a broad range of applications. For instance, thermoplastic films and sheets can be found in automotive applications, electronic applications, military applications, appliances, industrial equipment, and furniture.

Thermoplastic sheets and film can be reinforced or non-reinforced, porous or nonporous and can comprise a single thermoplastic or multiple thermoplastics. When a thermoplastic sheet or film comprises multiple thermoplastics it may be as a blend, as layers, or both.

One important use of films is their use as substrates, or coatings on, flexible circuit applications. In order to serve in this role a new film should meet two requirements critical for flexible circuit substrates, namely low coefficient of thermal expansion (CTE) and high temperature survivability (especially when a high temperature fabrication step is employed).

Low CTE is necessary to match, as closely as possible, the CTE of copper (CTE=17 ppm/° C.). This keeps the film from curling upon temperature change when the film is a substrate for a copper layer, or copper circuit traces. Low CTE also prevents unmatched changes in dimension between the copper and substrate layers upon thermal cycling, which increases the lifetime of the final flexible circuit by reducing stress and fatigue on the patterned copper traces. In other words, the properties of flexible circuit boards are benefited when their film substrate and applied conductive metal layer expand and contract at the same rate. When these layers don't expand and contract at the same rate issues regarding the adherence, and orientation of the layers can and do arise. While a CTE of less than 70 ppm/° C., specifically less than 60 ppm/° C., even more specifically less than 30 ppm/° C. will allow low warpage upon thermal cycling and is a common goal, better results will be achieved as the CTE of the film becomes closer to the CTE of copper.

A TMA or Thermomechanical Analysis tests CTE. The dimension change of a film sample is determined as a function of temperature, and from the slope of this change, the CTE is calculated. Typically, the CTE must be measured for the temperature range that the film is expected to see during flex circuit processing. A temperature range of 20 to 250° C. is a reasonable temperature range for determination of the CTE.

High temperature survivability can also be an important property for the substrate film to survive the soldering process during flex circuit fabrication. The film should exhibit survivability for short periods at elevated temperatures of, for example, 260° C. for new lead-free soldering processes. The standard test for temperature survivability is the solder float test, where a small piece of film is affixed to a cork and is immersed for 10 seconds in molten solder. The film is then removed, the solder is wiped off, and the film is examined. If there is any visible warpage or bubbling, the film fails the test. While there is not a standard thickness for this test, the minimum thickness at which the film passes the solder float test can be reported. Temperatures of 260° C. and 288° C. are standard solder float temperatures for lead-eutectic and lead-free solders, respectively.

Low CTE and high temperature resistance requirements for flexible circuit substrates have been addressed through the use of polyimide films. Many commercial polyimide (PI) films have a high glass transition temperature (greater than 350° C.), and can be partially crosslinked, giving exceptional temperature survivability. The polymer molecules in these films are stressed slightly as they are produced, leading to alignment of the polymer molecules and giving PI films a low CTE. Since the films never see temperatures above the glass transition temperature (Tg) of the material, the stress is never able to relax and the films are dimensionally stable at flex fabrication temperatures.

As thermoplastic sheets and films are used in an increasing wide array of applications the need for thermoplastic sheets and films that can withstand elevated temperatures for appropriate periods of time without substantial degradation is growing. There is a continuing need for films having: a) a CTE under seventy ppm/° C., specifically under thirty ppm/° C. and as close to the CTE of copper as technically possible; and b) high thermal survivability.

SUMMARY OF THE INVENTION

The present disclosure is directed to thermoplastic sheets and films that have a broad range of applications. For instance, thermoplastic films and sheets can be found in automotive applications, electronic applications, military applications, appliances, industrial equipment, and furniture.

In one embodiment, a solvent cast film comprises a polyimide comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, with a diamine component comprising 4,4'-diaminodiphenylsulfone; wherein the polyimide has a glass transition temperature from 190° C. to 400° C.; and wherein the film has a coefficient of thermal expansion of less than 60 ppm/° C., a thickness from 0.1 to 250 micrometers, and less than 5% residual solvent by weight.

A method of making a solvent cast polyimide film comprises casting a polyamic acid composition onto a substrate to form a film; heating the cast film for a time and at a temperature effective to remove the solvent and to form a solvent cast polyimide film having a coefficient of thermal expansion of less than 60 ppm/° C. and a thickness from 0.1 to 125 micrometers; and processing the solvent cast polyimide film to reduce the coefficient of thermal expansion of the film to below 35 ppm/° C.

In still another embodiment, a solvent cast film comprises a polyetherimide comprising structural units derived from the polymerization of a dianhydride component comprising a dianhydride selected from the group consisting 3,4'-oxydiphthalic dianhydride, 3,3'-oxydiphthalic dianhydride, 4,4'-oxydiphthalic dianhydride, and combinations thereof, with a diamine component with a diamine component comprising 4,4'-diaminodiphenylsulfone; wherein the polyimide has a glass transition temperature from 190° C. to 400° C.; wherein the film has a coefficient of thermal expansion of less than 60 ppm/° C., a thickness from 0.1 to 250 micrometers, and less than 5% residual solvent by weight; wherein the film has a coefficient of thermal expansion that is within +20 ppm/° C. of the coefficient of thermal expansion of copper, silicon, aluminum, gold, silver, nickel, a glass, a ceramic, or a polymer; and wherein the solvent is selected from the group consisting of N,N-dimethylacetamide, N,N-dimethylformamide, N-methylpyrolidinone, dimethylsulfoxide, sulfolane, tetrahydrofuran, benzophenone, cyclohexanone, phenol, o-cresol, p-cresol, m-cresol, phenol, ethylphenol, isopropylphenol, t-butylphenol, xylenol, mesitol, chlorophenol, dichlorophenol, phenylphenol, a monoalkyl ether of ethylene glycol having from 1 to about 4 carbon atoms in the alkyl group, a monoalkyl ether of diethylene glycol having from 1 to about 4 carbon atoms in the alkyl group, a monoaryl ether glycol, a monoaryl ether of propylene glycol, tetramethylurea, phenoxy ethanol, propylene glycol phenyl ether, anisole, veratrole, o-dichlorobenzene, chlorobenzene, trichloroethane, methylene chloride, chloroform, pyridine, N-cyclohexylpyrrolidinone, ethyl lactate, an ionic liquid, and a combination comprising at least two of the foregoing solvents.

In another embodiment, a solvent cast film comprises a polyetherimide comprising structural units derived from polymerization of 4,4'-oxydiphthalic dianhydride, and 4,4'-diaminodiphenylsulfone; wherein the polyimide has a glass transition temperature from 190° C. to 400° C.; wherein the film has a coefficient of thermal expansion of less than 60 ppm/° C., a thickness from 0.1 to 250 micrometers, endless than 5% residual solvent by weight; and wherein the film has less than 15 molar % of biphenyltetracarboxylic acid or its dianhydride or its ester.

A method of manufacture of a recycled a polyimide composition comprises melting the solvent cast polyimide film; and combining the melted solvent cast polyimide film with a polymer composition to form a recycled polyimide composition.

Another method of manufacture of a recycled a polyimide composition comprises dissolving the solvent cast polyimide film; and combining the dissolved film with a polymer composition to form the recycled polyimide composition.

An article comprising the recycled polyimide composition is also described.

BRIEF DESCRIPTION OF THE DRAWING

FIG. 1 is a graph of the time/temperature imidization profile used to prepare polyetherimides.

DETAILED DESCRIPTION OF THE INVENTION

As thermoplastic sheets and films are used in the specification and the claims which follow, reference will be made to a number of terms which shall be defined to have the following meanings. The singular forms "a," "an," and "the" include plural referents unless the context clearly dictates otherwise. Unless defined otherwise, technical and scientific terms used herein have the same meaning as is commonly understood by one of skill in the art. Compounds are described using standard nomenclature.

Other than in the operating examples or where otherwise indicated, all numbers or expressions referring to quantities of ingredients, reaction conditions, and the like, used in the specification and claims are to be understood as modified in all instances by the term "about." The term "combination thereof" means that one or more of the listed components is present, optionally together with one or more like components not listed. Various numerical ranges are disclosed in this patent application. Because these ranges are continuous, they include every value between the minimum and maximum values. Unless expressly indicated otherwise, the various numerical ranges specified in this application are approximations. The endpoints of all ranges directed to the same component or property are inclusive of the endpoint and independently combinable.

For purposes of the present invention, a "film" is a flat section of thermoplastic resin or other material that is extremely thin in comparison to its length and breadth.

The term "casting" refers to a process of molding or forming wherein impressions are made with fluent or molten materials as by pouring into a mold or onto a sheet with hardening or setting of said material in said mold or on said sheet.

A "solvent cast film" is a film formed through the casting of fluids on a forming surface to form a sheet or web with removal of solvent from the cast liquid.

All ASTM tests and data are from the 1991 edition of the Annual Book of ASTM Standards unless otherwise indicated.

"Coefficient of thermal expansion" is the increment in volume of a unit volume of polymer for a rise of temperature of 1° C. at constant pressure. For the present invention CTE measurements were performed by thermo-mechanical analysis (TMA) with a thermal ramp rate of 5° C./minute. Test specimen dimensions were 23 mm in length by 5 mm in width. Test specimens were subjected to a first heat from 0° C. to 250° C. at 5° C./min heating rate and CTE values were determined under a force of 0.05 Newtons from the slope of length change over the temperature range from 30° C. to 200° C.

"Chemical resistance" is the ability of solid materials to resist damage by chemical reactivity or solvent action, and can be determined in accordance with ASTM Test D543-06

"Dielectric Constant" (permittivity constant): between any two electrically charged bodies there is a force (attraction or repulsion) that varied according to the strength of the charges, q1 and q2, the distance between the bodies, r, and a characteristic of the medium separating the bodies (the dielectric) known as the dielectric constant, $\in$. This force is given by the equation: $F = q1 \cdot q2/(\in \cdot r^2)$.

"Flexural Modulus" (flex modulus) is the ratio, within the elastic limit, of the applied stress in the outermost fibers of a test specimen in three-point, static flexure, to the calculated strain in those outermost fibers, and can be determined according to ASTM Test D790 or D790M.

"Flexural Strength" (flexural modulus of rupture) is the maximum calculated stress in the outermost fibers of a test bar subjected to three-point loading at the moment of cracking or breaking. ASTM Test D 790 and D 790M are widely used for measuring this property. For most plastics, flexural strength is usually substantially higher than the straight tensile strength.

"Glass Transition" is a reversible change that occurs in an amorphous polymer or in amorphous regions of a partly crystalline polymer when it is heated from a very low temperature into a certain range, peculiar to each polymer, characterized by a rather sudden change from a hard, glassy, or brittle condition to a flexible or elastomeric condition. Physical properties such as coefficient of thermal expansion, specific heat, and density, usually undergo changes in their temperature derivatives at the same time. During the transition, the molecular chains, normally coiled, tangled, and motionless at the lower temperatures, become free to rotate and slip past each other.

"Glass Transition Temperature" (Tg) is the approximate midpoint of the temperature range over which the glass transition occurs. Tg is not obvious (like a melting point), and is detected by changes, with rising temperature, in secondary properties such as the rate of change with temperature of specific volume or electrical or mechanical properties. Moreover, the observed Tg can vary significantly with the specific property chosen for observation and on experimental details such as the rate of heating or electrical frequency. A reported Tg should therefore be viewed as an estimate. The most reliable estimates are normally obtained from the loss peak in dynamic-mechanical tests or from dilatometric data. For purposes of the present invention, the glass transition temperature (Tg) is determined by the maximum point of the tan delta curve. Tg can also be determined by the inflection of the DSC (Differential Scanning Calorimetry) trace (ASTM Test D3148).

"Melting Temperature" (hereafter identified by its symbol "$T_m$") is the temperature at which the thermal energy in a solid material is sufficient to overcome the intermolecular forces of attraction in the crystalline lattice so that the lattice breaks down and the material becomes a liquid, i.e. it melts. According to the present invention the $T_m$ is measured according to ASTM test D3148.

"Melt Viscosity" is the resistance to shear in a molten resin, quantified as the quotient of shear stress divided by shear rate at any point in the flowing material. Elongational viscosity, which comes into play in the drawing of extrudates, is analogously defined. In polymers, the viscosity depends not only on temperature and, less strongly, on pressure, but also on the level of shear stress (or shear rate). For purposes of the present invention melt viscosity is determined at 380° C. as measured by capillary rheology according to ASTM D3835.

"Moisture Absorption" is the pickup of water vapor by a material upon exposure for a definite time interval in an atmosphere of specified humidity and temperature. No ASTM test exists for this property. Moisture absorption at 50% relative humidity and by immersion in water is measured by weight gain.

"Tensile Modulus" or "Modulus of Elasticity" is the ratio of nominal tensile stress to the corresponding elongation below the proportional limit of the material. The relevant ASTM test is D638.

"Tensile Strength" is the maximum nominal stress sustained by a test specimen being pulled from both ends, at a specified temperature and at a specified rate of stretching. When the maximum nominal stress occurs at the Yield Point it shall be designated tensile strength at yield. When it occurs at break, it shall be designated tensile strength at break. The ASTM test for plastics is D638 (metric, D638M). The SI unit of tensile strength is the pascal ($N/m^2$).

Gallery spacing or d-spacing is the distance between the various microplates that make up a nanosilicate (synonymous with nano-clay, nano clay, or nanoclay). The changes in the gallery spacing appear to be dependent on the composition of the modified nanosilicate and the solvent.

"Intercalate" refers to a process by which the d-spacing is increased by the incorporation of a modifier, solvent, or a polymer between the plates. A modified nano clay has a d-spacing that is greater than that for the same unmodified nano clay.

"Exfoliate" refers to the complete separation of the plates that make up the clay structure. Sometimes there is incomplete exfoliation to smaller structures that have multiple plate that are called tactoids.

"Polyamic acid solution" (also known as poly-amide-acid, poly(amic acid), amic acid, polyamicacid, poly(amic acid), poly(amide acid), poly(amic) acid, poly(amide-acid), or polyamic-acid) is a solution containing amic acid units that have the capability of reacting with surrounding organic moieties to form imide groups.

"Polyimide" as used herein refers to polymers comprising repeating imide functional groups, and optionally additional functional groups such as amides and/or ethers. "Polyimide" accordingly includes within its scope polyamide imides and polyetherimides.

The term "inerted" means that the atmosphere in a container is replaced with an inert gas, such as for example, nitrogen.

"Recycle" means that all or a part of the polymer according to the present invention can be re-used for the original utility for which the polymer was made. For example, if the original use of the polymer as a solvent cast film for a flexible circuit board, all or part of the polymer can be recycled and be re-dissolved in solvent with or without the use of additional monomer or polymer. Recycle can also mean that the polymer can be re-used either in part or completely by another reprocessing method into another utility such as an injected molded part.

When structural units of chemical moieties are said to be formally derived from a precursor moiety herein, there is no implied limitation on the actual chemical reaction which may be used to produce the chemical moiety. For example when a chemical moiety such as a polyetherimide is said to have structural units formally derived from a dianhydride and a diamine, then any known method could be used to prepare the polyetherimide, including reaction of a dianhydride and a diamine, or a displacement reaction between a phenoxide species and an imide bearing a displaceable group, or other known method, it only being necessary that the chemical moiety comprise structural units which may be represented in the stated precursor moiety.

The present disclosure is directed to solvent cast films comprising a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, and a diamine component comprising 4,4'-diaminodiphenylsulfone, wherein the polyimide has a Tg from 180° C. and 450° C., specifically 190° C. or greater, and wherein the film has: a) a CTE of less than 70 ppm/° C., specifically less than 60 ppm/° C.; b) a thickness of between 5 micrometers and 250 micrometers, specifically 0.1 to 250 micrometers; and, c) contains less than 5% residual solvent by weight.

The solvent cast film according to the present invention can be made of at least one polyimide have a Tg of between 180° C. and 450° C. In another embodiment, the polyimide has a Tg of 190° C. or greater, specifically 190° C. to 500° C., more specifically 190° C. to 400° C. The skilled artisan will appreciate that the Tg of any particular polyimide can vary widely depending upon factors including the choice of dianhydride monomer, the number of different dianhydride monomers (structures as opposed to units), the choice of diamine monomer, the number of different diamine monomers (structures as opposed to units), processing conditions during production of the film, type of imidization process used to cure the polymer, etc. The skilled artisan will appreciate the ability to create a polymer having a desired Tg anywhere within the aforementioned range of Tg's, depending on the monomers used, the use of endcapping, etc.

The type of polyimide making up the film is similarly variable. The present invention specifically includes random and block polymers and co-polymers in all combinations of the one or more dianhydride and the one or more diamine from which the present polyimides can be made. More than one type of polyimide can be present, for example a combination of a polyamideimide and a polyetherimide, or two different kinds of polyetherimide. Also, the present invention is directed to solvent cast films comprising one or more polyimide films that includes other polymers selected from the group consisting of amorphous thermoplastic polymers including PPSU (polyphenylene sulfone), PSU (polysulfone), PC (polycarbonate), PPO (polyphenylene ether), PMMA (polymethylmethacrylate), ABS (acrylonitrile-butadiene-styrene terpolymer), PS (polystyrene), PVC (polyvinylchloride), crystalline thermoplastic resins including PFA (perfluoroalkoxyalkane), MFA (co-polymer of TFE (tetrafluoroethylene) and PFVE (perfluorinated vinyl ether)), FEP (fluorinated ethylene propylene polymers), PPS (polyphenylene sulfide), PEK (polyether ketone), PEEK (polyether-ether ketone), ECTFE (ethylene-chlorotrifluoroethylene copolymer), PVDF (polyvinylidene fluoride), PTFE (polytetrafluoroethylene), PET (polyethylene terephthalate), POM (polyacetal), PA (polyamide), UHMW-PE (ultra high molecular weight polyethylene), PP (polypropylene), PE (polyethylene), HDPE (high density polyethylene), LDPE (low density polyethylene), and advanced engineering resins such as PBI (polybenzimidazole), poly(ether sulfone), poly (aryl sulfone), polyphenylene ethers, polybenzoxazoles, and polybenzothiazoles, as well as blends and co-polymers thereof.

Measured CTE's of the films may be an inherent property of the material by virtue of the materials chemical make-up. Alternatively, the CTE may be significantly lower than the inherent CTE of the film material through the use of additives and or by the performance of additional processing steps. The CTE of the solvent cast film can be any CTE which is below 70 ppm/° C., specifically below 60 ppm/° C., and allows the film to function in its intended utility. For example, for a flexible circuit board the CTE can be close enough to that of the adjacent metallic conductive layer that the film is capable of serving its intended utility as a dielectric substrate, a layer in a laminate and/or a covering for a flexible circuit board. In separate embodiments, the CTE is less than 70 ppm/° C., less than 50 ppm/° C., less than 40 ppm/° C., less than 35 ppm/° C., less than 30 ppm/° C., or less than 20 ppm/° C. According to other embodiments, the film has a CTE of at least 5 ppm/° C. The film can also have a CTE of 5 to 60 ppm/° C., and more specifically the coefficient of thermal expansion is 10 ppm/° C. to 30 ppm/° C., and even more specifically 10 ppm/° C. to 20 ppm/° C.

Alternatively, the CTE of the film is adjusted to match a substrate material on which it is disposed. In one embodiment, the film has a CTE that is within ±20 ppm/° C. of the CTE of copper, silicon, aluminum, gold, silver, nickel, a glass, a ceramic, or a polymer, specifically within ±20 ppm/° C. of the CTE of copper, silicon, aluminum, gold, silver, or nickel. In another embodiment, the film has a CTE that is within ±15 ppm/° C. of the coefficient of thermal expansion of copper, silicon, aluminum, gold, silver, or nickel, specifically copper.

In an advantageous feature, it has been found that the CTE of the films is very stable. For example, the film after lamination to a substrate at a temperature from 250 to 450° C. has a CTE within ±10 ppm/° C. of the CTE of the film prior to lamination.

The thickness of the films can vary widely depending upon the end use application, the method of making the film, the solids contents of the casting solution, to name a few of the subject parameters. The thickness may vary from 0.1 micrometers up to 10,000 micrometers, or more particularly from 5 micrometers up to 1,000 micrometers, however it is expected that for use in flexible circuit boards the most likely thickness will be between 0.1 micrometers and 250 micrometers.

The final solvent cast film may contain residual solvent and still be capable of functioning for its intended purpose. The minimum amount of residual solvent will be the most residual solvent content under which the film will still function for its intended utility. One the other hand, the solvent cast films may also contain as low a residual solvent content as is possible to achieve. For example, solvent is expensive and can be an environmental hazard. Both a cost savings and an improvement of environmental conditions may be achieved by minimizing the amounts of solvent contained in final product. The residual solvent content will be less than 5% of the total weight of the film. In another embodiment, the amount of residual solvent will be less than 1% of the total weight of the film.

Solvents which can be used in the process include any solvent with which a solvent cast film may be made. The solvent can be a good solvent for polyimides, by for example, having a relatively high boiling to facilitate solution film formation or direct devolatization via extrusion. The solvent for film formation can be the same that is used to make the polyamic acid solution described below. Examples of suitable solvents include, but are not limited to, N-methyl pyrrolidinone (NMP), trichloroethane, N,N-dimethylacetamide (DMAc), N-methylpyrolidinone (NMP), dimethylsulfoxide (DMSO), sulfolane, tetrahydrofuran (THF), benzophenone, cyclohexanone, phenol, mixtures of o-, p- and m-cresols, mixtures of cresylic with phenol, ethylphenols, isopropylphenols, tert-butylphenols, xylenols, mesitols, chlorophenols, dichlorophenols, such as ortho-dichlorobenzene (o-DCB), phenylphenols, a monoalkyl ether of ethylene glycol having from 1 to 4 carbon atoms in the alkyl group, a monoalkyl ether of diethylene glycol having from 1 to 4 carbon atoms in the alkyl group, a monoaryl ether glycol, a monoaryl ether of propylene glycol, N,N-dimethylformamide, tetramethylurea, phenoxy ethanol, propylene glycol phenyl ether, anisole, veratrole, o-dichlorobenzene, chlorobenzene, trichloroethane, methylene chloride, chloroform, pyridine, N-cyclohexylpyrrolidinone, ethyl lactate, an ionic liquid, and mixtures containing one or more of these solvents. Ionic liquids generally include salts having a melting point that is relatively low (below 100° C.). Examples of ionic liquids include, but and are not limited to ammonium, imidazolium-, phosphonium-, pyridinium-, pyrrolidinium-, and sulfonium-based salts. Counter-ions in such liquids can include, but are not be limited to the following: bromides, chlorides, tetrafluoroborates, acetates, phosphates, carbonates, sulfates, methane sulfates, nitrates, thiocyanates, and combinations thereof.

The skilled artisan will appreciate that the specific solvent used is dependent on any number of factors including the solubility of the polyimide and the precursor monomers in a solvent, and the volatility of the solvent, for example.

Solvent cast films according to the present invention may be made by any method known in the art. The following patents assigned to GE disclose generic methods of making solvent cast films and casting solutions: U.S. Pat. Nos. 4,115,341; 4,157,996; 4,307,226; 4,360,633; 4,374,972; and, 3,847,867. One manufacturing process can involve the following steps: forming a polyamic acid solution comprising the polyamic acid product of a monomer component comprising one or more dianhydrides and one or more organic diamines at least partially dissolved in a solvent system; casting the polyamic acid solution onto a substrate such that the polyamic acid solution takes on a form having a length, width and depth on the surface of the substrate; removing the solvent, and curing the polyamic acid solution, e.g., by heating the cast film for a time and at a temperature effective to form a film having a CTE less than 70 ppm/° C., specifically less than 60 ppm/° C., and a thickness of from 0.5 micrometers to 250 micrometers, specifically 0.1 to 250 micrometers.

Alternatively, the method can comprise making a solvent cast film comprising: preparing a casting solution comprising a polyamic acid solution made up of a monomer component the forms a polyamic acid, and a solvent component; casting a film of the casting solution on a support base; removing solvent from the cast film for a predetermined period of time to form a solvent cast polyimide film having a CTE less than 70 ppm/° C., specifically less than 60 ppm/° C. and a thickness of between 0.1 micrometers and 250 micrometers, specifically between 5 and 250 micrometers; and conducting an additional process step on the solvent cast film to reduce the CTE of the film below 35 ppm/° C., specifically below 30 ppm/° C.

The polyamic acid solution may be prepared by mixing one or more dianhydride(s), water, and solvent as by stirring until the one or more dianhydride component is dissolved. Then the one or more monomeric diamine can be added and the solution stirred until the amines dissolve. The components which make up the dianhydride component and the diamine component may include 1, 2, 3, 4, 5, or more different dianhydrides and diamines. The scope of the present invention is specifically intended to include all permutations, and combinations of the number and variety of dianhydride and diamine monomers. For example, in one embodiment, the polyamic acid solution will be made up of two different dianhydrides and two different diamines. In another embodiment, one of the one or more dianhydrides is ODPA.

In general, the organic amine component may be included in an amount of from 0.5 mole to 2.0 moles, or, more particularly, from 1 to 1.3 moles, per mole of dianhydride component. Where more than one compound is included in a component of the present solution, the parts, moles, or other quantity of such component is taken as the sum of the parts, moles, or such other quantity, respectively, of each compound included in such component. Thus, for example, total amine content is calculated by adding the equivalent amounts of each diamine in the amine component e.g., 2(number of moles of $1^{st}$ diamine)+2(number of moles of $2^{nd}$ diamine)= total equivalents of amine.

Total anhydride content is calculated in a similar fashion. A slight excess of amine can be used to impart additional film flexibility or possible cross-linking. It has been found that polyimide enamel can have from 5 to 500 repeating dianhydride-diamine reaction product units and preferably from 10 to 200. Terminal amino and phthalic acid or phthalic anhydride or various suitable end groups can also be present.

Experience has shown that sufficient solvent should be utilized to provide a solids content to provide a solution with a workable viscosity for stirring and handling. In one embodiment, the solids content will be from 1-65% by weight. In other embodiments the solids content will be from 1-40%, 1-30%, 1-25%, 1-15%, or 1-12.5% by weight.

Solutions having high ratios of monomeric reactants to organic solvent component advantageously minimize the amount of organic solvent released during subsequent formation and cure of polyetherimide resins as in the manufacture of solvent cast film. Such solutions having high amounts of monomeric reactants may have higher viscosities than desired for some solvent cast films. Typically, inclusion of water decreases the solution viscosity. A given decrease in viscosity may be effected using a lower amount of added water relative to the amount of added organic solvent component which would be required to effect the same viscosity decrease.

Water may or may not be a part of the polyamic acid solution. Water may be present in any amount up to the maximum amount at which the solution is substantially free of precipitate. Although water is miscible with the organic solvent component in substantially all proportions, inclusion of too much water in the present monomeric solution results in precipitate or other plural phase formation. The amount of water which may be present depends on the particular dianhydride and diamine components, the particular organic solvent component, and the weight ratio of monomeric reactants to organic solvent.

Advantageously, the present polyamic acid solutions may include the monomeric reactants in a combined amount of 40 or more weight percent, e.g. from 40 to 75 or more weight percent, based on the weight of the solution. In general, such high monomer content solutions, including water as may be required, have suitable viscosities in the temperature range, e.g., 15° C. to 200° C., normally used to make solvent cast films.

Solutions including water are more easily prepared by adding the monomeric reactant components with stirring to a solution of the water and organic solvent component. Preparation of the solution is generally accelerated at elevated temperatures.

An additive can be added to the polyamic acid solutions in order to reduce the CTE below the CTE that the material would have without the additive. These additives include those which will aid in lowering the CTE of the solvent cast film, and those which can aid in producing another desirable property in the present films. These ingredients may be used in any amount to impart the desired property at proportions of from 0.001 to 60 parts of additive, per 100 parts by weight of polyimide. Alternatively these additives may be added in amounts from 0.01 to 30 parts of additive, and more particularly from 0.1 to 10 parts of additive per 100 parts by weight of polyimide.

The types of additives which can be employed to lower the CTE of a solvent cast polyimide film include modified nanocomposite silicates (nanoclays) and soluble nano-particle precursors such as aluminum (acetylacetonoate)$_3$.

A nanoclay can be added directly to the polyamic acid composition after it is formed. It has also been found that polyimide can be readily solubilized in an exfoliated nanocomposite solution, and that exfoliation can be maintained after removal of the solvent by devolatization or precipitation into nonsolvent. The resulting polyimide-nanocomposite materials can be formed into films via solution casting or melt extrusion. The resulting films have high Tg and low CTE.

Moreover, it has been found that polymerization of a diamine and dianhydride in the presence of organically modified nanosilicates results in good dispersion of the modified nanofiller. The nanofilled polyimide composite can be formed into films by melt extrusion or solution casting to give a low CTE, high Tg, polyimide film.

Exfoliated nanoclays are most commonly used. Exfoliation, e.g., by sonication, is carried out in a solvent system. For example exfoliating is carried out in a composition comprising from 10 to 90% by weight of the nanoclay and from 10 to 90% by weight of the solvent system. Exfoliation can be performed before addition to the polyamic acid solution, after addition to the polyamic acid solution, or before reacting the dianhydride component and the organic diamine component in the solvent system. Alternatively, addition of a high molecular weight polymer to the exfoliated nanosilicate solution results in exfoliated high Tg nanocomposites. These materials can be formed into films by solution casting to give a low CTE polyimide film. In one embodiment homogenization of the modified nanosilicate in the selected solvent is followed by sonication. Sonication can be performed in either a batch or continuous process. In the batch process, the homogenized modified silicate/solvent mixture is placed in contact with the sonic source. The mixture is stirred well to ensure uniform sonication of the entire mixture. In the continuous process, the modified nanosilicate/solvent mixture is flowed through the sonic zone at a given rate. The modified nanosilicate/solvent mixture is stirred well to ensure a uniform dispersion of the nanosilicate. In either the batch or continuous process, the sonication conditions required for exfoliation (i.e. flow rate, sonication power, sonication time) depends on the type of modifier used, solvent, batch size, configuration and size of the sonic source, and temperature at which sonication takes place. Intercalation and exfoliation of the nanosilicate particles can be observed via X-ray diffraction (XRD) of the resulting solution. Exfoliation can be more directly observed by combining the sonicated nanosilicate solution with a polyimide solution, removing the solvent by evaporation or precipitation, casting or pressing a film and performing TEM analysis.

The nanosilicates may be exfoliated such that the materials d-spacing is greater than the material would have, but for the exfoliation step. According to the present invention the d-spacing can be any that is greater than the unmodified nanosilicate that will lower the CTE of the polyimide film. According to alternate embodiments, the modified nanosilicates will have d-spacings greater than 15, 20, 25, 30, 40, 50, and 75 Angstroms.

It has been found that use of nanoclays, particularly exfoliated nanoclays provides unexpected advantages. Films comprising a nanoclay can have a lower CTE than a film of the same composition without the nanoclay. Alternatively, or in addition, films comprising a nanoclay can have a Tg that is the same as a film of the same composition without the nanoclay. A film comprising a nanoclay can also be transparent. The amount of nanoclay used in the film will vary, depending on the desired film properties. For example, the film can comprise from 0.1 to 10 wt % nanoclay, specifically 1 to 10 wt % nanoclay, based on the total weight of the film.

The nanosilicate can have an organic modifier with cationic functionality and may be thermally stable at film forming processing temperatures.

A general methodology for making solvent cast films according to this process involves dispersing the modified clay either by sonication or high shear mixing in the chosen solvent (for example, DMAc). The clay dispersion is formulated to be in the range of 1-15% solids by weight, or more particularly, 1-5% solids by weight. The monomers, at least one dianhydride monomer and at least one diamine monomer, are added to the clay dispersion to form a modified polyamic acid solution. Also, instead of adding polyamic acid to the clay dispersion, fully imidized soluble polyimides can be dissolved in solvents such as DMAc and NMP in the range of 5-25% solids by weight, for example 10% by weight. In another embodiment, a 10% by weight solution of the dried film in dimethylacetamide or N-methylpyrolidinone has an inherent viscosity of greater than 0.05 dl/g. The polyimide solution can then be combined with the clay dispersion and cast as above.

Another additive which can be employed to lower the CTE of solvent cast polyimide films are metal oxide nanoparticles which can be formed from an organo-metallic precursor. Metal oxide nanoparticles can be generated in situ by decomposing an organometallic precursor. One example of such a material is aluminum(acetylacetonate)$_3$ (Al(acac)$_3$). Thermolysis of (Al(acac)$_3$) yields aluminum oxide. When done in dilute solution (small molecule solvent or polymer melt) $Al_2O_3$ nanoparticles are formed. Targeting a 1% by weight loading of $Al_2O_3$ in the final polymer, the precursor can be added upfront to the polymerization of dianhydride and diamine monomers, specifically oxydiphthalic anhydride and diaminodiphenylsulfone. Resultant polymer filled with $Al_2O_3$ nanoparticles exhibited a CTE lowered by more than 15% compared to an unfilled control sample.

In addition to the organo-metallic precursor being added to the polymerization, the precursor can be solvent blended with the polyamic acid solution, or finished soluble polyimide, or blended and extruded with finished polymer to yield a filled system. The materials in solution can be cast as films and cured to give the filled film. Other suitable organo-metallic precursors include metal(acac) complexes, and ceramic precursors such as molybdenum sulfide.

Other classes of additives which can be used to impart a desirable property other than, or in addition to lowering the CTE of a polyimide film, include fillers and reinforcements for example fiber glass, milled glass, glass beads, flake and the like. Minerals such as talc, wollastonite, mica, kaolin, or montmorillonite clay, silica, fumed silica, perlite, quartz, and barite may be added. The compositions can also be modified with effective amounts of inorganic fillers, such as, for example, carbon fibers and nanotubes, glass fibers, metal fibers, metal powders, conductive carbon, and other additives including nano-scale reinforcements.

In some cases a metal oxide may be added to the polymers of the present invention. In some instances the metal oxide may further improve flame resistance (FR) performance by decreasing heat release and increasing the time to peak heat release. Titanium dioxide is of note. Other metal oxides include zinc oxides, boron oxides, antimony oxides, iron oxides, and transition metal oxides. Metal oxides that are white may be desired in some instances. Metal oxides may be used alone or in combination with other metal oxides. Metal oxides may be used in any effective amount, in some instances at from 0.01 to 20% by weight of the polymer.

Other useful additives include smoke suppressants such as metal borate salts, for example zinc borate, alkali metal or alkaline earth metal borate or other borate salts. Additionally other boron containing compounds, such as boric acid, borate esters, boron oxides, or other oxygen compounds of boron may be useful. Additionally other flame retardant additives, such as aryl phosphates and brominated aromatic compounds, including polymers containing linkages made from brominated aryl compounds, may be employed. Examples of halogenated aromatic compounds are brominated phenoxy resins, halogenated polystyrenes, halogenated imides, brominated polycarbonates, brominated epoxy resins and mixtures thereof.

In some instances it maybe desired to have flame retardant compositions that are essentially free of halogen atoms, especially bromine and chlorine. Essentially free of halogen atoms means that in some embodiments the composition has less than 3% halogen, specifically chlorine and/or bromine by weight of the composition, and in other embodiments less than 1% by weight of the composition contains halogen atoms, specifically chlorine and/or bromine. The amount of halogen atoms can be determined by ordinary chemical analysis.

The composition may also optionally include a fluoropolymer in an amount of 0.01 to 5.0% fluoropolymer by weight of the composition. The fluoropolymer may be used in any effective amount to provide anti-drip properties to the resin composition. Some examples of suitable fluoropolymers and methods for making such fluoropolymers are set forth, for example, in U.S. Pat. Nos. 3,671,487, 3,723,373 and 3,383,092. Suitable fluoropolymers include homopolymers and copolymers that comprise structural units derived from one or more fluorinated alpha-olefin monomers. The term "fluorinated alpha-olefin monomer" means an alpha-olefin monomer that includes at least one fluorine atom substituent. Some of the suitable fluorinated alpha-olefin monomers include, for example, fluoroethylenes such as, for example, $CF_2=CF_2$, $CHF=CF_2$, $CH_2=CF_2$, and $CH_2=CHF$ and fluoro propylenes such as, for example, $CF_3CF=CF_2$, $CF_3CF=CHF$, $CF_3CH=CF_2$, $CF_3CH=CH_2$, $CF_3CF=CHF$, $CHF_2CH=CHF$, and $CF_3CF=CH_2$.

Some of the suitable fluorinated alpha-olefin copolymers include copolymers comprising structural units derived from two or more fluorinated alpha-olefin monomers such as, for example, poly(tetrafluoro ethylene-hexafluoro ethylene), and copolymers comprising structural units derived from one or more fluorinated monomers and one or more non-fluorinated monoethylenically unsaturated monomers that are copolymerizable with the fluorinated monomers such as, for example, poly(tetrafluoroethylene-ethylene-propylene) copolymers. Suitable non-fluorinated monoethylenically unsaturated monomers include for example, alpha-olefin monomers such as, for example, ethylene, propylene, butene, acrylate monomers such as for example, methyl methacrylate, butyl acrylate, and the like, with poly(tetrafluoroethylene) homopolymer (PTFE) preferred.

Other additives which may be added to the solvent cast films include antioxidants such as phosphites, phosphonites, and hindered phenols. Phosphorus containing stabilizers, including triaryl phosphite and aryl phosphonates, are of note as useful additives. Difunctional phosphorus containing compounds can also be employed. Stabilizers with a molecular weight of 300 Daltons or more are preferred. In other instances phosphorus containing stabilizers with a molecular weight of greater than or equal to 500 Daltons are useful. Phosphorus containing stabilizers are typically present in the composition at 0.05-0.5% by weight of the formulation. Colorants as well as light stabilizers and UV absorbers may also be used. Flow aids and mold release compounds are also contemplated. Examples of mold release agents are alkyl carboxylic acid esters, for example, pentaerythritol tetrastearate, glycerin tri-stearate, and ethylene glycol distearate. Mold release agents are typically present in the composition at 0.05-0.5% by weight of the formulation. Preferred mold release agents will have high molecular weight, typically greater than 300 Daltons, to prevent loss if the release agent from the molten polymer mixture during melt processing.

Compositions used to form the articles according to the present invention may also include various additives such as nucleating, clarifying, stiffness, and/or crystallization rate agents. These agents are used in a conventional matter and in conventional amounts.

The compositions can be blended with the aforementioned ingredients by a variety of methods involving intimate mixing of the materials with any additional additives desired in the formulation. A preferred procedure includes solution blending, although melt blending may be employed after the solvent cast film is made. Illustrative examples of equipment used in such melt processing methods include co-rotating and counter-rotating extruders, single screw extruders, co-kneaders, disc-pack processors, and various other types of extrusion equipment.

Liquid coating solutions can be formed using the above-described polyimide compositions, as well as film-forming solutions. The liquid coating solutions have many and varied uses. The coating solutions can be applied to a variety of substrates using any suitable coating method, e.g. dipping, brushing, spraying, wiping and the like, and thereafter heated to evaporate the solvent system and form cured polyetherimide resinous coatings. The temperature is preferably increased gradually to produce smooth resinous coatings. The polymerization and cure proceeds advantageously at a temperature of from 125° C. to 300° C. or more.

The polyamic acid solution can also be used as a coating solution which may be applied immediately upon preparation or stored prior to use. In general, maximum storage life can be obtained by storing the solutions under a nitrogen blanket in the absence of light.

Polymers used to make the solvent cast films and coatings are polyimides and in some specific instances, polyetherimides. Polyimides according to the present invention have the general formula (1):

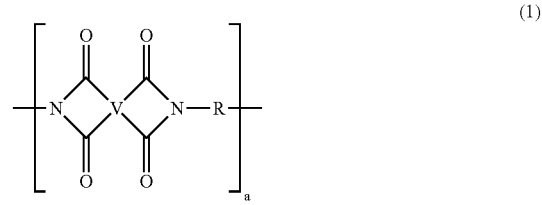

wherein a is more than 1, typically 10 to 1,000 or more, or more specifically 10 to 500; and wherein V is a tetravalent linker without limitation, as long as the linker does not impede synthesis or use of the polyimide. Suitable linkers include but are not limited to: (a) substituted or unsubstituted, saturated, unsaturated or aromatic monocyclic and polycyclic groups having 5 to 50 carbon atoms, (b) substituted or unsubstituted, linear or branched, saturated or unsaturated alkyl groups having 1 to 30 carbon atoms; or combinations comprising at least one of the foregoing. Suitable substitutions and/or linkers include, but are not limited to, ethers, epoxides, amides, esters, and combinations comprising at least one of the foregoing. At least a portion of the linkers V contain a portion derived from a bisphenol. Desirably linkers include but are not limited to tetravalent aromatic radicals of structures (2):

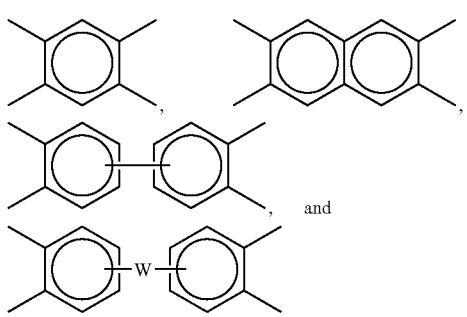
(2)

wherein W is a divalent moiety including —O—, —S—, —C(O)—, —SO$_2$—, —SO—, —C$_y$H$_{2y}$— (y being an integer from 1 to 5), and halogenated derivatives thereof, including perfluoroalkylene groups, or a group of the formula —O—Z—O— wherein the divalent bonds of the —O— or the —O—Z—O— group are in the 3,3',3,4',4,3', or the 4,4' positions, and wherein Z includes, but is not limited, to divalent radicals of formulas 3:

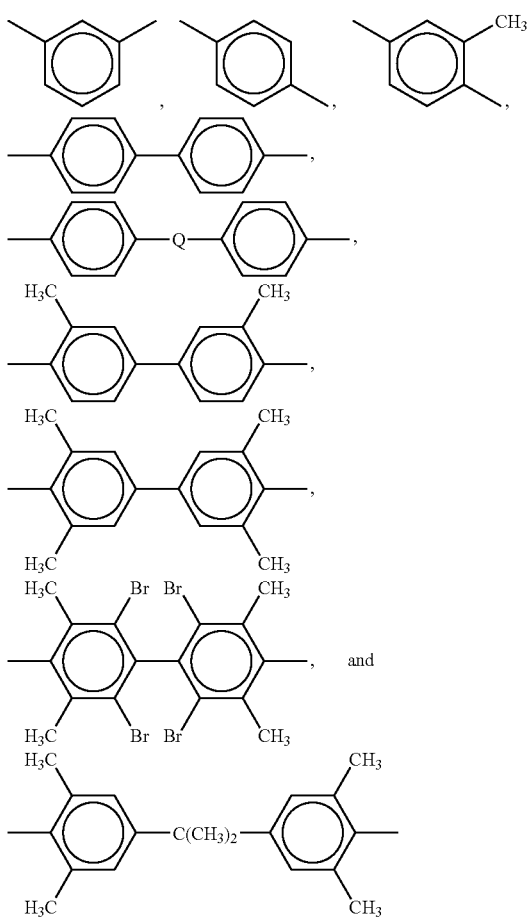
(3)

wherein Q includes but is not limited to a divalent moiety including —O—, —S—, —C(O)—, —SO$_2$—, —SO—, —C$_y$H$_{2y}$— (y being an integer from 1 to 5), and halogenated derivatives thereof, including perfluoroalkylene groups.

R in formula (1) includes but is not limited to substituted or unsubstituted divalent organic radicals such as: (a) aromatic hydrocarbon radicals having 6 to 20 carbon atoms and halogenated derivatives thereof, (b) straight or branched chain alkylene radicals having 2 to 20 carbon atoms; (c) cycloalkylene radicals having 3 to 20 carbon atoms, or (d) divalent radicals of the general formula (4):

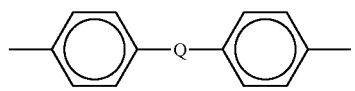
(4)

wherein Q includes but is not limited to a divalent moiety including —O—, —S—, —C(O)—, —SO$_2$—, —SO—, —C$_y$H$_{2y}$— (y being an integer from 1 to 5), and halogenated derivatives thereof, including perfluoroalkylene groups.

Exemplary classes of polyimides include polyamidimides and polyetherimides, particularly those polyetherimides which are melt processable, such as those whose preparation and properties are described in U.S. Pat. Nos. 3,803,085 and 3,905,942.

Exemplary polyetherimide resins comprise more than 1, typically 10 to 1,000, or more specifically, 10 to 500 structural units, of the formula (5):

(5)

wherein T is —O— or a group of the formula —O—Z—O— wherein the divalent bonds of the —O— or the —O—Z—O— group are in the 3,3',3,4',4,3', or the 4,4' positions, and wherein Z includes, but is not limited, to divalent radicals of formula 10 as defined above.

In one embodiment, the polyetherimide may be a copolymer which, in addition to the etherimide units described above, further contains polyimide structural units of the formula (6):

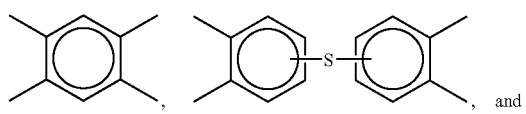
(6)

wherein R is as previously defined for formula (6) and M includes, but is not limited to, radicals of the following formulas:

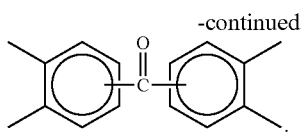

The polyetherimide can be prepared by various methods, including, but not limited to, the reaction of an aromatic bis(ether anhydride) of the formula (7):

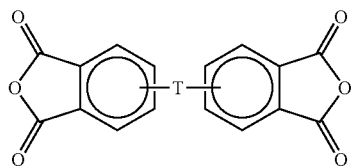

with an organic diamine of the formula (8):

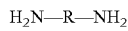 (8)

wherein R and T are defined in relation to formulas (1) and (5).

Examples of specific aromatic bis(ether anhydride)s and organic diamines are disclosed, for example, in U.S. Pat. Nos. 3,972,902 and 4,455,410. Illustrative examples of dianhydride molecules include:

2,2-bis[4-(3,4-dicarboxyphenoxy)phenyl]propane dianhydride;
4,4'-bis(3,4-dicarboxyphenoxy)diphenylether dianhydride;
4,4'-bis(3,4-dicarboxyphenoxy)diphenylsulfide dianhydride;
4,4'-bis(3,4-dicarboxyphenoxy)benzophenone dianhydride;
4,4'-bis(3,4-dicarboxyphenoxy)diphenylsulfone dianhydride;
2,2-bis[4-(2,3-dicarboxyphenoxy)phenyl]propane dianhydride;
4,4'-bis(2,3-dicarboxyphenoxy)diphenylether dianhydride;
4,4'-bis(2,3-dicarboxyphenoxy)diphenylsulfide dianhydride;
4,4'-bis(2,3-dicarboxyphenoxy)benzophenone dianhydride;
4,4'-bis(2,3-dicarboxyphenoxy)diphenylsulfone dianhydride;
4-(2,3-dicarboxyphenoxy)-4'-(3,4-dicarboxyphenoxy) diphenyl-2,2-propane dianhydride;
4-(2,3-dicarboxyphenoxy)-4'-(3,4-dicarboxyphenoxy) diphenylether dianhydride;
4-(2,3-dicarboxyphenoxy)-4'-(3,4-dicarboxyphenoxy) diphenylsulfide dianhydride;
4-(2,3-dicarboxyphenoxy)-4'-(3,4-dicarboxyphenoxy)benzophenone dianhydride;
4-(2,3-dicarboxyphenoxy)-4'-(3,4-dicarboxyphenoxy) diphenylsulfone dianhydride;
1,3-bis(2,3-dicarboxyphenoxy)benzene dianhydride;
1,4-bis(2,3-dicarboxyphenoxy)benzene dianhydride;
1,3-bis(3,4-dicarboxyphenoxy)benzene dianhydride;
1,4-bis(3,4-dicarboxyphenoxy)benzene dianhydride;
3,3',4,4'-diphenyl tetracarboxylic dianhydride;
3,3',4,4'-benzophenonetetracarboxylic dianhydride;
naphthalic dianhydrides, such as 2,3,6,7-naphthalic dianhydride, etc.;
3,3',4,4'-biphenylsulphonictetracarboxylic dianhydride;
3,3',4,4'-biphenylethertetracarboxylic dianhydride;
3,3',4,4'-dimethyldiphenylsilanetetracarboxylic dianhydride;
4,4'-bis(3,4-dicarboxyphenoxy)diphenylsulfide dianhydride;
4,4'-bis(3,4-dicarboxyphenoxy)diphenylsulphone dianhydride;
4,4'-bis(3,4-dicarboxyphenoxy)diphenylpropane dianhydride;
3,3',4,4'-biphenyltetracarboxylic dianhydride;
bis(phthalic)phenylsulphineoxide dianhydride;
p-phenylene-bis(triphenylphthalic)dianhydride;
m-phenylene-bis(triphenylphthalic)dianhydride;
bis(triphenylphthalic)-4,4'-diphenylether dianhydride;
bis(triphenylphthalic)-4,4'-diphenylmethane dianhydride;
2,2'-bis(3,4-dicarboxyphenyl)hexafluoropropane dianhydride;
4,4'-oxydiphthalic dianhydride;
pyromellitic dianhydride;
3,3',4,4'-diphenylsulfonetetracarboxylic dianhydride;
4',4'-bisphenol A dianhydride;
hydroquinone diphthalic dianhydride;
6,6'-bis(3,4-dicarboxyphenoxy)-2,2',3,3'-tetrahydro-3,3,3',3'-tetramethyl-1,1'-spirobi[1H-indene]dianhydride;
7,7'-bis(3,4-dicarboxyphenoxy)-3,3',4,4'-tetrahydro-4,4,4',4'-tetramethyl-2,2'-spirobi[2H-1-benzopyran]dianhydride;
1,1'-bis[1-(3,4-dicarboxyphenoxy)-2-methyl-4-phenyl]cyclohexane dianhydride;
3,3',4,4'-diphenylsulfonetetracarboxylic dianhydride;
3,3',4,4'-diphenylsulfidetetracarboxylic dianhydride;
3,3',4,4'-diphenylsulfoxidetetracarboxylic dianhydride;
4,4'-oxydiphthalic dianhydride;
3,4'-oxydiphthalic dianhydride;
3,3'-oxydiphthalic dianhydride;
3,3'-benzophenonetetracarboxylic dianhydride;
4,4'-carbonyldiphthalic dianhydride;
3,3',4,4'-diphenylmethanetetracarboxylic dianhydride;
2,2-bis(4-(3,3-dicarboxyphenyl)propane dianhydride;
2,2-bis(4-(3,3-dicarboxyphenyl)hexafluoropropane dianhydride;
(3,3',4,4'-diphenyl)phenylphosphinetetracarboxylic dianhydride;
(3,3',4,4'-diphenyl)phenylphosphineoxidetetracarboxylic dianhydride;
2,2'-dichloro-3,3',4,4'-biphenyltetracarboxylic dianhydride;
2,2'-dimethyl-3,3',4,4'-biphenyltetracarboxylic dianhydride;
2,2'-dicyano-3,3',4,4'-biphenyltetracarboxylic dianhydride;
2,2'-dibromo-3,3',4,4'-biphenyltetracarboxylic dianhydride;
2,2'-diiodo-3,3',4,4'-biphenyltetracarboxylic dianhydride;
2,2'-trifluoromethyl-3,3',4,4'-biphenyltetracarboxylic dianhydride;
2,2'-bis(1-methyl-4-phenyl)-3,3',4,4'-biphenyltetracarboxylic dianhydride;
2,2'-bis(1-trifluoromethyl-2-phenyl)-3,3',4,4'-biphenyltetracarboxylic dianhydride;
2,2'-bis(1-trifluoromethyl-3-phenyl)-3,3',4,4'-biphenyltetracarboxylic dianhydride;
2,2'-bis(1-trifluoromethyl-4-phenyl)-3,3',4,4'-biphenyltetracarboxylic dianhydride;
2,2'-bis(1-phenyl-4-phenyl)-3,3',4,4'-biphenyltetracarboxylic dianhydride;
4,4'-bisphenol A dianhydride;
3,3',4,4'-diphenylsulfoxidetetracarboxylic dianhydride;
4,4'-carbonyldiphthalic dianhydride;
3,3',4,4'-diphenylmethanetetracarboxylic dianhydride;
2,2'-bis(1,3-trifluoromethyl-4-phenyl)-3,3',4,4'-biphenyltetracarboxylic dianhydride, and all isomers thereof, as well as a combination of the foregoing.

The bis(ether anhydride)s can be prepared by the hydrolysis, followed by dehydration, of the reaction product of a nitro substituted phenyl dinitrile with a metal salt of a bisphenol compound (e.g., BPA) in the presence of a dipolar, aprotic solvent. An exemplary class of aromatic bis(ether anhydride)s included by formula (7) above includes, but is not limited to, compounds wherein T is of the formula (9):

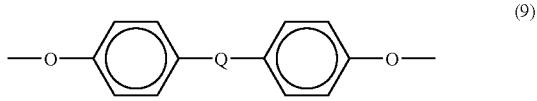

and the ether linkages, for example, are in the 3,3',3,4',4,3', or 4,4' positions, and mixtures comprising at least one of the foregoing, and where Q is as defined above.

Any diamino compound may be employed. Examples of suitable compounds are:
m-phenylenediamine;
p-phenylenediamine;
2,4-diaminotoluene;
2,6-diaminotoluene;
m-xylylenediamine;
p-xylylenediamine;
benzidine;
3,3'-dimethylbenzidine;
3,3'-dimethoxybenzidine;
1,5-diaminonaphthalene;
bis(4-aminophenyl)methane;
bis(4-aminophenyl)propane;
bis(4-aminophenyl)sulfide;
bis(4-aminophenyl)sulfone;
bis(4-aminophenyl)ether;
4,4'-diaminodiphenylpropane;
4,4'-diaminodiphenylmethane(4,4'-methylenedianiline);
4,4'-diaminodiphenylsulfide;
4,4'-diaminodiphenylsulfone;
4,4'-diaminodiphenylether(4,4'-oxydianiline);
1,5-diaminonaphalene;
3,3'dimethylbenzidine;
3-methylheptamethylenediamine;
4,4-dimethylheptamethylenediamine;
2,2',3,3'-tetrahydro-3,3,3',3'-tetramethyl-1,1'-spirobi[1H-indene]-6,6'-diamine;
3,3',4,4'-tetrahydro-4,4,4',4'-tetramethyl-2,2'-spirobi[2H-1-benzopyran]-7,7'-diamine;
1,1'-bis[1-amino-2-methyl-4-phenyl]cyclohexane, and isomers thereof as well as mixtures and blends comprising at least one of the foregoing.

Desirably, the diamino compounds are aromatic diamines, especially m- and p-phenylenediamine and mixtures comprising at least one of the foregoing.

In one embodiment, the polyetherimide resin comprises structural units according to formula 12 wherein each R is independently p-phenylene or m-phenylene or a mixture comprising at least one of the foregoing and T is a divalent radical of the formula (10):

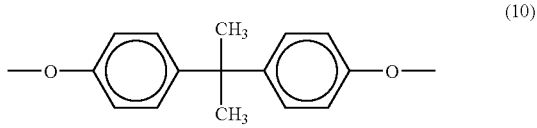

Included among the many methods of making the polyimides, particularly polyetherimides, are those disclosed in U.S. Pat. Nos. 3,847,867, 3,850,885, 3,852,242, 3,855,178, 3,983,093, and 4,443,591.

The reactions can be carried out employing solvents, e.g., o-dichlorobenzene, m-cresol/toluene and the like, to effect a reaction between the anhydride of formula (7) and the diamine of formula (8), at temperatures of 100° C. to 250° C. Chain stoppers and branching agents may also be employed in the reaction.

When polyimide copolymers of ether-containing and non-ether containing subunits are used, a dianhydride, such as pyromellitic anhydride, is used in combination with the bis (ether anhydride). The polyimides can optionally be prepared from reaction of an aromatic bis(ether anhydride) with an organic diamine in which the diamine is present in the reaction mixture at less than or equal to 0.2 molar excess. Under such conditions the polyetherimide resin may have less than or equal to 15 microequivalents per gram (µeq/g) acid titratable groups, or, more specifically less than or equal to 10 microequivalents/g acid titratable groups, as shown by titration with chloroform solution with a solution of 33 weight percent (wt %) hydrobromic acid in glacial acetic acid. Acid-titratable groups are essentially due to amine end-groups in the polyetherimide resin.

One route for the synthesis of polyimides proceeds through a bis(4-halophthalimide) having the following structure (11):

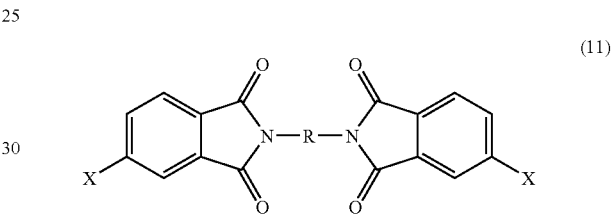

wherein R is as described above and X is a halogen. The bis(4-halophthalimide) wherein R is a 1,3-phenyl group (12) is particularly useful.

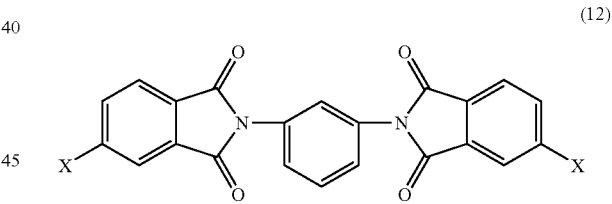

Bis(halophthalimide)s (11) and (12) are typically formed by the condensation of amines, e.g., 1,3-diaminobenzene with anhydrides, e.g., 4-halophthalic anhydride (13):

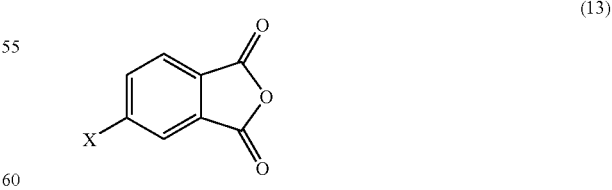

Polyetherimides may be synthesized by the reaction of the bis(halophthalimide) with an alkali metal salt of a bisphenol such as bisphenol A or a combination of an alkali metal salt of a bisphenol and an alkali metal salt of another dihydroxy substituted aromatic hydrocarbon in the presence or absence of phase transfer catalyst. Suitable phase transfer catalysts are disclosed in U.S. Pat. No. 5,229,482. Suitable dihydroxy substituted aromatic hydrocarbons include those having the formula (14):

OH-A²-OH (14)

wherein $A^2$ is a divalent aromatic hydrocarbon radical. Suitable $A^2$ radicals include m-phenylene, p-phenylene, 4,4'-biphenylene, and similar radicals.

As described above, virgin polyimides can be used in the formation of the solvent cast polyimide films. However, in a specific embodiment, the polyimide films comprise up to 50 wt %, specifically up to 30 wt %, of a recycled polyimide. The recycled polyimide, prior to recycling, can have a glass transition temperature from 210° C. to 450° C. In one embodiment, virgin polyimide is melt blended with recycled polyimide, for example polyimide that has already been formed into a film as described above. In another embodiment, virgin polyimide is solvent mixed with recycled polyimide, for example polyimide that has been formed into a film as described above. Polyimide compositions comprising the recycled polyimide can then be formed into a casting composition and be cast as described above, for example from a composition comprising 1 to 30 wt % solids. In the foregoing embodiments, the CTE of the film comprising the recycled polyimide can be within ±10 ppm/° C. of a film having the same composition without the recycled polyimide.

The above described solvent cast polyimide films can be used to manufacture recycled compositions for a variety of uses. The recycled compositions can be formed by melt bending (when the recycled film is capable of being melt blended) or by solvent mixing. In one embodiment, a method for the manufacture of recycled polyimide composition comprises melting the solvent cast polyimide film as described herein; and combining the melted solvent cast polyimide film of claim 1 with a polymer composition to form a recycled a polyimide composition. In another embodiment, a method of manufacture of a recycled a polyimide composition comprises dissolving the solvent cast polyimide film and combining the dissolved film of claim 1 with a polymer composition to form the recycled polyimide composition. In either of the foregoing embodiments, the polymer composition can comprise a virgin polyimide. The recycled compositions can then be used in the manufacture of compositions and articles as is known in the art. For example, the recycled polyimide composition can be extruded, or cast as described above. Articles comprising the recycled polyimide compositions are within the scope of the invention.

As an alternative to creating a solvent cast film having a CTE less than 70 ppm/° C., in another embodiment less than 60 ppm/° C., or in another embodiment, less than 35 ppm/° C., it is possible to add an additional process step to lower the CTE of a solvent cast film having a CTE above 70 ppm/° C., above 60 ppm/° C., or in another embodiment, above 35 ppm/° C., to a CTE below 60 ppm/° C. and in another embodiment less than 35 ppm/° C., specifically less than 30 ppm/° C.

The CTE of a solvent cast film can be reduced by biaxially stretching as described in U.S. Pat. No. 5,460,890. Similarly, the CTE of a melt extruded film or fully imidized solvent cast film can be reduced by thermally biaxially stretching as described in U.S. Pat. No. 5,260,407. The skilled artisan will be familiar with the other known methods of lowering the CTE of a polyimide film.

For example, a film with a low in-plane CTE may be obtained from polyimide resin compositions because the resin exhibits a partial crystallinity after annealing, and the crystalline phases can be aligned in two dimensions through biaxial stretching after extrusion. The film can then be heat set while constrained in a frame, returning the amorphous portion of the film back to a random unoriented configuration while retaining the alignment of the crystalline phases (and also inducing more aligned crystalline domains). The alignment of the crystalline phases results in a film with a low CTE. Since the amorphous part of the material is returned to its random state the film will not exhibit shrinkage, even when taken above the Tg of the material. This can lead to a dimensionally stable film at flex fabrication temperatures, because the crystalline domains are stable to temperatures above 400° C. The film has high temperature survivability due to the high Tg of the material and the partial crystallinity. The Tg of the material is above the temperature of the solder float test, which makes the material survive this test as well. The polymer crystals do not melt until temperatures exceeding 400° C., which is well above the temperatures seen during flex fabrication. The crystals act as effective crosslinks below Tm, holding the material together for high temperature survivability. The crystallization kinetics of the composition identified below is fairly slow, allowing the material to be melt extruded to a film before significant crystallization takes place. The film can then be heat set above Tg to induce crystallinity.

Very good film properties are obtained when a specific combination of dianhydrides are used, especially when the specific dianhydrides are used in combination with specific diamines. In one embodiment, the dianhydrides comprise 3,4'-oxydiphthalic anhydride, 3,3'-oxydiphthalic anhydride, 4,4'-oxydiphthalic anhydride, and combinations thereof. Other, additional dianhydrides can be present to adjust the properties of the films. In one embodiment, however, the polyimide has less than 15 molar % of structural units derived from a member of the group consisting of biphenyltetracarboxylic acid, a dianhydride of biphenyltetracarboxylic acid, an ester of biphenyltetracarboxylic acid, and combinations thereof.

Alternatively, the polyimides are formed from a dianhydride component that consists essentially of 3,4'-oxydiphthalic anhydride, 3,3'-oxydiphthalic anhydride, 4,4'-oxydiphthalic anhydride, and combinations thereof. In still another embodiment, the polyimides are formed from a dianhydride component that consists of 3,4'-oxydiphthalic anhydride, 3,3'-oxydiphthalic anhydride, 4,4'-oxydiphthalic anhydride, and combinations thereof.

It has further been found films having excellent properties are obtained when the diamine component further comprises m-phenylenediamine, p-phenylenediamine, 4,4'-oxydianiline, 1,3-bis(4-aminophenoxy)benzene, 1,3-bis(3-aminophenoxy)benzene, and combinations thereof. In one embodiment, the diamine component consists essentially of 4,4'-diaminodiphenyl sulfone, m-phenylenediamine, p-phenylenediamine, 4,4'-oxydianiline, 1,3-bis(4-aminophenoxy)benzene, 1,3-bis(3-aminophenoxy)benzene, and combinations thereof. In another embodiment, the diamine component consists of 4,4'-diaminodiphenyl sulfone, m-phenylenediamine, p-phenylenediamine, 4,4'-oxydianiline, 1,3-bis(4-aminophenoxy)benzene, 1,3-bis(3-aminophenoxy)benzene, and combinations thereof, and no other diamines are present.

The polyimides are further advantageously formed from structural units wherein the diamine component comprises greater than or equal to 10 mole % of 4,4'-diaminodiphenyl sulfone, based on the total moles of diamine component. In one embodiment the diamine component comprises 10 to 100 mole % of 4,4'-diaminodiphenyl sulfone.

The films can have a number of advantageous properties, in addition to low CTE, useful Tg, and low solvent retention. In one embodiment, the film is stable, that is, loses less than 5% of its initial weight after storage in water for 24 hours at 25° C., specifically less than 2% of its initial weight after storage in water for 24 hours at 25° C.

The liquid coating solutions, film casting solutions, coatings, and solvent cast films of the present invention have many and varied uses. The coating solutions may be applied to a variety of substrates using any suitable coating method, e.g. dipping, brushing, spraying, wiping and the like, and thereafter heated to evaporate the solvent system and form cured polyimide resinous coatings and/or solvent cast films. The temperature is preferably increased gradually to produce smooth resinous coatings. The polyimide-forming reaction proceeds advantageously at a temperature of from 125° C. to 450° C. or more.

The present coating and casting solutions, including compositions comprising a recycled polyimide film, may be employed to manufacture a variety of articles comprising the solvent cast polyimide films. In one embodiment, the film is disposed on a substrate. A variety of substrates can be used, for example copper, silicon, aluminum, gold, silver, nickel, a glass, a ceramic, and a polymer, including a polymeric release layer. In one embodiment, the substrate is a solvent cast polyimide film comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, with a diamine component; wherein the polyimide has a glass transition temperature of at least 190° C.; wherein the film has a coefficient of thermal expansion of less than 60 ppm/° C., a thickness from 0.1 to 250 micrometers, endless than 5% residual solvent by weight; wherein the polyimide has less than 15 molar % of structural units derived from a member selected from the group consisting of biphenyltetracarboxylic acid, a dianhydride of biphenyltetracarboxylic acid, an ester of biphenyltetracarboxylic acid, and a combination thereof. A first and a second substrate having the same or different compositions can be disposed on opposite sides of the solvent cast film.

In one embodiment, the coating and casting solutions is used to manufacture a laminate comprising the solvent cast polyimide film, a conductive layer comprising a metal, wherein a side of the film is adheringly disposed on a side of the conductive layer. The conductive metal can be copper, silver, gold, aluminum, or an alloy comprising at least one of the foregoing metals. In a specific embodiment, the metal is copper and wherein the solvent cast film has a coefficient of thermal expansion less than 35 ppm/° C.

In another embodiment, films for circuit boards, including flexible circuit boards. In this embodiment, a solvent cast polyetherimide film is adheringly disposed on an electrically conductive substrate, for example a face of a metal layer such as copper, wherein the metal is etched to provide a circuit. A second substrate, e.g., another layer of a conductive material, i.e., a metal such as copper, can be disposed on a side of the film opposite the first substrate. The flexible printed circuit can further comprise a dielectric layer comprising a second dielectric material other than the polyimide of the film.

Other specific articles that can be manufactured using the solvent cast polyimide films include capacitors, which in their simplest embodiment comprise a solvent cast polyimide film adheringly disposed between two electrically conductive layers, e.g., two copper layers.

In still another embodiment, the solutions can be used as wire enamels to form resinous insulating coatings on copper and aluminum wire. In this embodiment, the polyimide film forms a coating on an electrically conductive wire that surrounds at least a portion of the radial surface of the wire.

The solutions can also be used as varnishes for coating or impregnating various substrates such as coils of previously insulated wire (e.g. in motor and generator coils), as well as woven and non-woven fabrics, and the like. The solvent cast films of the present invention may also be used for chip-on-flex (COF), and tape automated bonding (TAB) applications. The term "articles" can also include speaker cones, tapes and labels, wire wraps, etc.

EXAMPLES

Without further elaboration, it is believed that the skilled artisan can, using the description herein, make and use the present invention. The following examples are included to provide additional guidance to those skilled in the art of practicing the claimed invention. These examples are provided as representative of the work and contribute to the teaching of the present invention. Accordingly, these examples are not intended to limit the scope of the present invention in any way. Unless otherwise specified below, all parts are by weight and all temperatures are in degrees Celsius.

Materials

ODPA is a dianhydride monomer also known as 4,4'-oxydiphthalic anhydride which can be made as described in U.S. Pat. No. 6,028,203, U.S. Pat. No. 4,870,194, or U.S. Pat. No. 5,021,168.

BPDA is a dianhydride monomer also known as 3,3',4,4'-biphenyltetracarboxylic dianhydride which is commercially available from Chriskev Company, with offices in Leawood, Kans.

PMDA is a dianhydride monomer also known as pyromellitic dianhydride, which is commercially available from Aldrich Chemical Company, with offices in Milwaukee, Wis.

BPADA is a dianhydride monomer also known as 2,2-bis[4-(3,4-dicarboxyphenoxy)phenyl]propane dianhydride, which is commercially available from Aldrich Chemical Company, with offices in Milwaukee, Wis.

BTDA is a dianhydride monomer also known as 3,3'-benzophenonetetracarboxylic dianhydride which is commercially available from TCI America, with offices in Portland, Oreg.

BPhDA is a dianhydride monomer also known as 4,4'-bis(3,4-dicarboxyphenoxy)biphenyl dianhydride which can be made as described in the Journal of Polymer Science, Polymer Chemistry Edition, 1985, vol. 23(6), pp 1759-1769.

DDS is a diamine monomer also known as 4,4'-diaminodiphenylsulfone, which is commercially available from Chriskev Company, with offices in Leawood, Kans.

MPD is a diamine monomer also known as meta-phenylenediamine, which is commercially available from Aldrich Chemical Company, with offices in Milwaukee, Wis.

PPD is a diamine monomer also known as para-phenylenediamine, which is commercially available from Aldrich Chemical Company, with offices in Milwaukee, Wis.

ODA is a diamine monomer also known as 4,4'-oxydianiline, which is commercially available from Chriskev Company, with offices in Leawood, Kans.

1,3,4-APB is a diamine monomer also known as 1,3-bis(4-aminophenoxy)benzene, which is commercially available from Chriskev Company, with offices in Leawood, Kans.

1,3,3-APB is a diamine monomer also known as 1,3-bis(3-aminophenoxy)benzene, which is commercially available from Chriskev Company, with offices in Leawood, Kans.

TPPBr is a phosphonium salt also known as tetraphenylphosphonium bromide, which is commercially available from Fluorochem Ltd., with offices in Old Glossop, United Kingdom.

Sodium montmorillonite is an inorganic layered silicate, which is commercially available from Sud-Chemie, with offices in Dusseldorf, Germany.

spreadsheet calculator was constructed that calculates the grams of each monomer based upon the total grams polymer desired and the monomer feeds of dianhydride and amine. The skilled artisan will appreciate that there are many different ways of ascertaining the correct amount by weight of each ingredient to be used in making the films according to the present invention. It is within the ability of the skilled artisan to calculate the weight amount of ingredients based on the overall stoichiometry and the final percent solids of the reaction mechanism enunciated herein.

Casting Procedure: The correct molar percentages of dianhydride and diamine as shown in Table 1 were weighed on an analytical balance to four decimal place accuracy.

TABLE 1

| | | Dianhydrides | | | | | | Diamines | | | | |
|---|---|---|---|---|---|---|---|---|---|---|---|---|
| Ex. | Solvent | ODPA (%) | BPDA (%) | BTDA (%) | BPhDA (%) | PMDA (%) | BPADA (%) | DDS (%) | PPD (%) | 133APB (%) | 134APB (%) | MPD (%) | ODA (%) |
| 1 | DMAc | 50 | 0 | 0 | 0 | 0 | 0 | 50 | 0 | 0 | 0 | 0 | 0 |
| 2 | NMP/CH | 40 | 10 | 0 | 0 | 0 | 0 | 50 | 0 | 0 | 0 | 0 | 0 |
| 3 | NMP/CH | 10 | 40 | 0 | 0 | 0 | 0 | 50 | 0 | 0 | 0 | 0 | 0 |
| 4 | NMP/CH | 40 | 10 | 0 | 0 | 0 | 0 | 50 | 0 | 0 | 0 | 0 | 0 |
| 5 | NMP/CH | 10 | 40 | 0 | 0 | 0 | 0 | 50 | 0 | 0 | 0 | 0 | 0 |
| 6 | NMP/CH | 40 | 10 | 0 | 0 | 0 | 0 | 40 | 10 | 0 | 0 | 0 | 0 |
| 7 | NMP/CH | 40 | 10 | 0 | 0 | 0 | 0 | 10 | 40 | 0 | 0 | 0 | 0 |
| 8 | NMP/CH | 10 | 40 | 0 | 0 | 0 | 0 | 40 | 10 | 0 | 0 | 0 | 0 |
| 9 | NMP/CH | 10 | 40 | 0 | 0 | 0 | 0 | 10 | 40 | 0 | 0 | 0 | 0 |
| 10 | DMAc | 45 | 0 | 5 | 0 | 0 | 0 | 50 | 0 | 0 | 0 | 0 | 0 |
| 11 | DMAc | 5 | 0 | 45 | 0 | 0 | 0 | 50 | 0 | 0 | 0 | 0 | 0 |
| 12 | DMAc | 40 | 10 | 0 | 0 | 0 | 0 | 50 | 0 | 0 | 0 | 0 | 0 |
| 13 | DMAc | 10 | 40 | 0 | 0 | 0 | 0 | 50 | 0 | 0 | 0 | 0 | 0 |
| 14 | DMAc | 40 | 10 | 0 | 0 | 0 | 0 | 40 | 10 | 0 | 0 | 0 | 0 |
| 15 | DMAc | 40 | 10 | 0 | 0 | 0 | 0 | 10 | 40 | 0 | 0 | 0 | 0 |
| 16 | DMAc | 10 | 40 | 0 | 0 | 0 | 0 | 40 | 10 | 0 | 0 | 0 | 0 |
| 17 | DMAc | 10 | 40 | 0 | 0 | 0 | 0 | 10 | 40 | 0 | 0 | 0 | 0 |
| 18 | DMAc | 45 | 0 | 0 | 5 | 0 | 0 | 50 | 0 | 0 | 0 | 0 | 0 |
| 19 | DMAc | 0 | 45 | 0 | 5 | 0 | 0 | 50 | 0 | 0 | 0 | 0 | 0 |
| 20 | DMAc | 50 | 0 | 0 | 0 | 0 | 0 | 50 | 0 | 0 | 0 | 0 | 0 |
| 21 | DMAc | 50 | 0 | 0 | 0 | 0 | 0 | 40 | 0 | 0 | 0 | 10 | 0 |
| 22 | DMAc | 50 | 0 | 0 | 0 | 0 | 0 | 40 | 10 | 0 | 0 | 0 | 0 |
| 23 | DMAc | 50 | 0 | 0 | 0 | 0 | 0 | 40 | 0 | 0 | 0 | 0 | 10 |
| 24 | DMAc | 50 | 0 | 0 | 0 | 0 | 0 | 10 | 0 | 0 | 0 | 40 | 0 |
| 25 | NMP | 45 | 0 | 0 | 5 | 0 | 0 | 50 | 0 | 0 | 0 | 0 | 0 |
| 26 | NMP | 0 | 45 | 0 | 5 | 0 | 0 | 50 | 0 | 0 | 0 | 0 | 0 |
| 27 | NMP | 0 | 0 | 0 | 5 | 45 | 0 | 50 | 0 | 0 | 0 | 0 | 0 |
| 28 | NMP | 0 | 0 | 45 | 5 | 0 | 0 | 50 | 0 | 0 | 0 | 0 | 0 |
| 29 | DMAc | 50 | 0 | 0 | 0 | 0 | 0 | 10 | 40 | 0 | 0 | 0 | 0 |
| 30 | DMAc | 50 | 0 | 0 | 0 | 0 | 0 | 10 | 0 | 0 | 0 | 0 | 40 |
| 31 | DMAc | 10 | 40 | 0 | 0 | 0 | 0 | 50 | 0 | 0 | 0 | 0 | 0 |
| 32 | DMAc | 10 | 40 | 0 | 0 | 0 | 0 | 0 | 50 | 0 | 0 | 0 | 0 |
| 33 | DMAc | 10 | 40 | 0 | 0 | 0 | 0 | 40 | 0 | 0 | 0 | 10 | 0 |
| 34 | DMAc | 10 | 40 | 0 | 0 | 0 | 0 | 40 | 10 | 0 | 0 | 0 | 0 |
| 35 | DMAc | 10 | 40 | 0 | 0 | 0 | 0 | 40 | 0 | 0 | 0 | 0 | 10 |
| 36 | DMAc | 10 | 40 | 0 | 0 | 0 | 0 | 10 | 0 | 0 | 0 | 40 | 0 |
| 37 | DMAc | 10 | 40 | 0 | 0 | 0 | 0 | 10 | 40 | 0 | 0 | 0 | 0 |
| 38 | DMAc | 10 | 40 | 0 | 0 | 0 | 0 | 10 | 40 | 0 | 0 | 0 | 0 |
| 39 | DMAc | 50 | 0 | 0 | 0 | 0 | 0 | 40 | 0 | 0 | 10 | 0 | 0 |
| 40 | DMAc | 50 | 0 | 0 | 0 | 0 | 0 | 10 | 0 | 0 | 40 | 0 | 0 |
| 41 | DMAc | 40 | 10 | 0 | 0 | 0 | 0 | 10 | 40 | 0 | 0 | 0 | 0 |
| 42 | DMAc | 40 | 10 | 0 | 0 | 0 | 0 | 10 | 0 | 0 | 0 | 0 | 40 |
| 43 | DMAc | 10 | 40 | 0 | 0 | 0 | 0 | 0 | 10 | 0 | 40 | 0 | 0 |

CH = cyclohexanone

Examples 1-43

Film Casting Procedure and Experimental for Examples 1-43:

Inventive formulations 1-43 were prepared using the compositions specified in Table 1. The amounts of each monomer were calculated at a stoichiometry of 1 amine for every anhydride with no correction for purity, (corrections for purity can effect the final molecular weight of the polymer and could effect the final performance of the article). A Microsoft Excel spreadsheet calculator was constructed that calculates the The monomers were then transferred to a scintillation vial and the weigh paper used was rinsed with the solvent. The remaining volume of solvent was transferred to the vial and the vial was rendered inert with nitrogen. The sealed inert vial was then placed on a shaker overnight to produce a poly(amic acid) solution. The poly(amic acid) solution was then drop cast through a 0.45 micrometer filter onto clean glass slides, prepared in advance by cleaning with hexanes.

The coated slides were then placed on a hotplate equipped with: a thermocouple; a ramp and soak temperature controller; a nitrogen purge; and, a cover. The films were then imidized following the heating profile outlined in Table 2 and FIG. 1:

TABLE 2

| temp (° C.) | time (min) |
|---|---|
| 25 | 0 |
| 40 | 45 |
| 40 | 60 |
| 120 | 90 |
| 120 | 120 |
| 160 | 150 |
| 160 | 165 |
| 200 | 180 |
| 200 | 195 |
| 300 | 210 |

Upon completion of the imidization reaction, the films so produced were removed from the glass slide for use in later examples, or for thorough property testing.

TABLE 3

| Example | CTE (ppm/° C.) | Tg (° C.) | Solubility**** DMAc | Solubility**** NMP | Metal Adhesion | Equilib moisture (%) | Moisture absorption (%) |
|---|---|---|---|---|---|---|---|
| 1 | 42 | 318*** | | | | | |
| 2 | 45* | 349 | | | | 1.6 | 4.3 |
| 3 | 43* | 325*** | | | | | |
| 6 | 44* | 285 | | | | | |
| 8 | 47* | 327 | | | | | |
| 9 | 43* | 315 | | | | | |
| 10 | 45 | 314 | + | + | 3 | | |
| 11 | 50 | 327 | | | | | |
| 12 | 45 | | + | + | | | |
| 13 | 43 | | | | | | |
| 14 | 26 | 320 | + | + | 4 | 0.3 | 1.9 |
| 15 | 23 | | − | − | 2 | 0.2 | 0.9 |
| 16 | 9 | 320 | | | | | |
| 17 | 43 | 349 | | | | | |
| 18 | 41*/44 | | | | | 1 | 2.2 |
| 19 | 40*/41 | | | | | | |
| 20 | 47** | 319 | + | + | 5 | 1.5 | 3.3 |
| 21 | 48** | | | | | | |
| 22 | 47** | | | | | | |
| 23 | 48** | | | | | | |
| 24 | 43** | | | | | | |
| 28 | 43 | | | | | | |
| 31 | 41 | | | | | | |
| 32 | 10 | | | | | | |
| 33 | 38 | | | | | | |
| 34 | 41 | | | | | | |
| 35 | 42 | | | | | | |
| 36 | 36 | | | | | | |
| 37 | 16 | | | | | | |
| 39 | 43 | | | | | | |
| 40 | 48 | | | | | | |
| 41 | 21 | ND | | | | | |
| 43 | 44 | | | | | | |

*CTE Measured from 30-150° C.
**CTE Measured from 30-175° C.
***Tg determined by DMA
ND no Tg detected by DSC
****A + indicates at 10 wt % solids the cured film dissolves. A − indicates that at 10 wt % solids the film did not completely dissolve.

Weight % (wt %) is defined as: [weight of component/ (weight of component+weight of all other components)]× 100. Because the initial curing profile was not optimum for every formulation/solvent combination, some of the films were not suitable for testing described in Table 3 and thus not represented. It should be recognized by those skilled in the art that a suitable combination of solvent and thermal processing profile might be developed to make films that can be tested.

Example 44

Detailed Film Casting Example:

On an analytical balance, 0.5937 g (0.001914 mol) of 4,4'-oxydiphthalic anhydride and 0.4752 g (0.001914 mol) of 4,4'-diaminodiphenylsulfone were weighed out to be with in 0.0005 g of the desired weight. The monomers were transferred to a 20 mL scintillation vial, rinsing the weigh paper with 2.0 mL of dimethylacetamide, to ensure complete transfer of the monomers. The remaining solvent (5.47 mL of dimethylacetamide) was transferred by volumetric pipette to give a solution of 12.5 weight % solids. The vial was rendered inert by flowing nitrogen through the vial for one minute and then quickly capping the vial. The sample was then placed on the shaker overnight to form a poly(amic acid) solution.

Glass slides (Fisherbrand precleaned microscope slides) were cleaned with hexanes. The solution (2.0 mL) was then filtered through a 0.45 micrometer syringe tip filter onto a glass slide. The solution coated glass slide was then placed on a hotplate equipped with a ramp and soak temperature controller, a cover, and a controlled nitrogen purge of 85 liters (3 cubic feet) per hour (apparatus volume of 0.1 cubic feet). The sample was then imidized using the thermal profile outline described above for examples 1-8 and detailed in Tables 3 and FIG. 1. Following imidization the film was released from the glass slide by immersion in water at 25° C., to yield a freestanding polyimide film. The film was then used for later examples or submitted for testing and analysis.

Example 45

Detailed Film Casting Example:

On an analytical balance, 0.7559 g of 4,4'-oxydiphthalic anhydride and 0.1210 g of diaminodiphenylsulfone and 0.2108 g of para-phenylene diamine were weighed out to be with in 0.0005 g of the desired weight. The monomers were transferred to a 20 mL scintillation vial, rinsing the weigh paper with 1.0 mL of dimethylacetamide, to ensure complete transfer of the monomers. The remaining solvent (5.47 mL of dimethylacetamide) was transferred by volumetric pipette to give a solution of 12.5 weight % solids. The vial was rendered inert by flowing nitrogen through the vial for one minute and then quickly capping the vial. The sample was then placed on the shaker overnight to form a poly(amic acid) solution.

Glass slides (Fisherbrand precleaned microscope slides) were cleaned with hexanes. The solution (2.0 mL) was then filtered through a 0.45-micrometer syringe tip filter onto a glass slide. After the solution was filtered onto the slide a 635-micrometer doctor blade (25 mil gap) was used to yield a wet film. (final film thickness is a function of concentration and gap on the doctor blade).

The solution coated glass slide was then placed on a hotplate equipped with a ramp and soak temperature controller, a cover, and a controlled nitrogen purge of 85 liters (3 cubic feet) per hour (apparatus volume of 0.1 cubic feet). The sample was then imidized using the thermal profile outline described above for examples 1-43 and detailed in Tables 2 and FIG. 1. Following imidization the film was released from the glass slide by immersion in water at 25° C., to yield a freestanding polyimide film. The film was then used for later examples or submitted for testing and analysis.

Example 46

Additional examples were performed with the following terms being defined:

DSC: Differential Scanning Calorimetry was conducted on a Perkin Elmer DSC 7 with a heating rate of 20° C./min and the glass transition measured in the second heat. This method is based upon ASTM D3418.

DMA: Film samples cut precisely to give known length width and thickness were analyzed on a dynamic mechanical analyzer in a tensile mode with a frequency of 1 Hz and heating rate of 5° C./min over the temperature range 40-350° C. Dynamic mechanical analysis (DMA) is conducted in accordance to ASTM test D5026, with the exception that only one test specimen is tested. The glass transition temperature (Tg) is determined by the maximum point of the tan delta curve.

TMA: CTE values of the cast films were measured on a thermo-mechanical analyzer with a heating rate of 5° C./min from 0-250° C. CTE values were calculated from the slope over the range of 30-200° C.

Equilibrium water: The equilibrium water content was defined as the moisture content of films allowed to stand at ambient conditions in the lab for 72 h (about 25° C. and 70% RH). The moisture content was measured by accurately weighing a sample of film 10.2 centimeters×1.27 centimeters×63.5 micrometers (about 4 in×0.5 in×0.0025 in) before and after a drying. Films were weighed (to 0.00005 g), dried in a 150° C. oven for 4 h, and then immediately weighed to determine the moisture loss. Equilibrium water content is the mass lost upon heating divided by the mass of the dried film as a percent.

Moisture absorption: Dried film samples (oven at 150° C. for 4 h) of known mass were submerged in water for 72 h at ambient temperature (25° C.). Following the time period, the films were removed from the water and the excess moisture removed by drying with a Kimwipe. Moisture absorption is the mass uptake upon soaking in water divided by the weight of the dried film as a percent.

Solubility: A positive result indicates that at a concentration of 10% solids, the fully imidized film cast from the poly(amic acid) solution dissolves in dimethylacetamide or N-methylpyrolidinone (solvent indicated in the test) and can pass through a 0.45 micrometer filter.

Example 47, Part A

Modification of Nano Clays.

Procedure for the Preparation of Organically Modified Clay:

The organically modified clay was prepared via ion exchange in water or a combination of water and an alcohol, or water and acetonitrile. The $Na^+$ MMT (a clay with sodium counterions) was dispersed in water or water/solvent combination at 1-5% by weight and heated to 80° C. The organic cation, tetraphenylphosphonium bromide, was dissolved or dispersed water or solvent combination as above in a ratio such that when the solution or dispersion of the organic cation was added to the clay dispersion there is organic cations equal to or in excess of the cation ion exchange capacity of the dispersed clay. The mixture was then heated to reflux for 1-2 h. Following cooling to room temperature, the modified clay is collected by centrifugation. The supernatant was poured off, and the solid modified clay was washed by redispersing the clay in deionized water or deionized water solvent combination and recollected by centrifugation. The wash solution was poured off and the wash process is repeated twice more. Following the final centrifugation, the solid clay was dried in an oven and then ground to a fine powder.

Example 47, Part B

Detailed example: 2.0 g of $NA^+$ MMT clay (cation exchange capacity of 0.000926 mols $Na^+$/g of clay; 0.001852 mols of cations total) was dispersed in 200 mL of a 50/50 mixture of deionized water and ethanol and brought to reflux. Tetraphenylphosphonium bromide (1.4167 g, 0.002216 mols) was added and the dispersion was allowed to stir at reflux for two hours. The mixture was cooled to room temperature and transferred to four 50 mL centrifuge tubes. The tubes were placed on a centrifuge and spun at 3000 rpm for 5 min. The supernatant is poured off and redispersing the clay in fresh mixture of 50/50 deionized water and ethanol washes the remaining solid, and solid was again collected again by centrifugation. The wash procedure was repeated twice more. Following the final centrifugation and decantation the remaining solid was dried in a 120° C. oven for two hours and then ground to a fine powder. Properties of Organic Modified Montmorillonite Prepared from Aromatic Phosphonium Salts are shown in Table 4.

TABLE 4

| Modifier | d-Spacing (Angstrom) | MW of modifier | Wt loss on TGA under $N_2$ at 900° C. (%) | TGA 5% loss under $N_2$ (° C.) | Wt loss at 400° C. under $_{N2}$ for 30 min (%) |
|---|---|---|---|---|---|
| TPP | 17.8 | 339.4 | 25.0 | 449.0 | 3.1 |

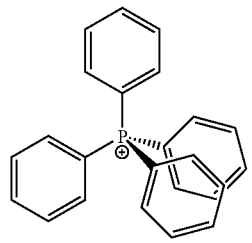

Example 48

Detailed Experimental Method of Lowering the CTE of a Film Using Aluminum(AcAc)$_3$ Soluble nanoparticle precursors: Aluminum(acetylacetonoate)$_3$ was added to a solution of poly(amic acid) prepared as above in any of examples 1-43, or a solution of a soluble polyimide in DMAc to give a solution with 5-30% polyimide precursor or polyimide and 0.5%-31.8% Al (acac)$_3$. The solution was then filtered onto a glass slide. The coated substrate was then placed on the hotplate and subjected to a thermal profile described in examples 1-43 as described above to complete imidization. The films so formed were then removed from the glass slide and used in later examples, or subjected to analysis.

Example 49

Detailed Experimental Analysis of Adhesion of Films to Copper

Metal Adhesion: 2.54 centimeter square (one inch square) film samples were sandwiched between two pieces of copper foil. One piece of foil has a roughened granular surface to enhance adhesion, the other copper surface was polished smooth. The stack was then pressed between the parallel plates of a heated press at 421° C. (790° F.) for one minute with three tons of pressure on the hydraulic ram. The adhesion of the film to copper was then graded using a scale of 1-5. A one indicates no adhesion to either surface. A two indicates moderate adhesion to the roughened copper. A three indicates good adhesion to the roughened copper surface, a four indicates good adhesion to the roughened surface and moderate adhesion to the smooth surface. A five indicates good adhesion to both copper surfaces equal to or better than the benchmark films. The benchmark materials are GE resins XH6050 extruded film and CRS5001 extruded film.

Example 50

Detailed Example of Solvent Cast Film with Nano Filler for Lowering CTE

Cloisite 30B clay from Southern Clay was dispersed in N,N-dimethylacetamide (DMAc) (13 g of clay in 5001 mL of solvent) by high shear mixing with a Silverson mixer. The monomers, 4,4'-oxydiphthalic anhydride (0.5640 g), 4,4-diaminodiphenylsulfone (0.3611 g), and oxydianiline (0.0903 g) were added to the clay dispersion and the mixture was diluted with additional DMAc to give a final mixture of 12.5% solids (polymer to solvent) and 3% filler (clay to polymer). The vial was inerted with $N_2$ and shaken overnight to form a viscous polyamic acid solution. This solution was then cast upon precleaned glass microscope slides and imidized using the heating profile described previously. The resulting nano filled polyimide film was peeled from the glass substrate for testing. The resulting film had a $T_g$=304 C and a CTE of 44 ppm/C.

Example 51

Film Recycle Example:

Film scrap of example 6 (40ODPA/10BPDA//40DDS/10pPD) was dissolved in 120° C. DMAc at 5 wt % solids. The solution was filtered through a 0.45-micrometer filter. The solution was then cast upon a glass substrate and heated slowly on a hotplate equipped with a ramp and soak temperature controller, a cover, and a controlled nitrogen purge. The temperature was slowly raised to 200° C. over 4 h maintaining a partial atmosphere of DMAc vapor for the first three hours to control the solvent evaporation rate. The resulting polyimide film was released from the glass substrate by immersion in water and allowing the water to float the film from the substrate.

Example 52

Film Recycle Example:

Alternatively the polyimide solution from example 51 was combined with monomers to give a solution of polyimide and poly(amic acid). 1.0 g of film from example 6 were dissolved in 7 g of DMAc to give a solution of 12.5 wt % solids as in example 51. A poly(amic acid) solution of example 6 was formulated and the two solutions were combined to give a final solution of 12.5 wt % solids. 1-20% of the composition resulting from redissolved scrap film would be suitable for this procedure. The solution was then cast upon a glass substrate and imidized with the thermal profile in Example 1 and released from the substrate.

Example 53

Film Recycle Example:

Alternatively, the polyimide film scrap of example 6 was ground to a powder using a mill and then blended with a polyetherimide resin such as the GE resin XH6050 or other high performance polymer (such as polyetherketone or polysulfone) by first mixing the two powders in a shaker with up to 30% by weight ground film scrap. The powder/powder blend was then extruded on a single or twin screw extruder and pelletized. The blend was then either molded into a finished part by injection molding or is extruded into a film.

Example 54

Solubility Testing Examples: Applicable to any Films:

A piece of film with the formulation 40ODPA/10BPDA//40DDS/10pPD with a mass of 0.6420 g was added to a vial containing 10 mL of dimethylacetamide. The vessel was inerted with nitrogen and capped. The contents were heated at 120° C. for 24 h with gentle stirring. The solution after 24 h hours was yellow in color with a slight haziness and no pieces of the film remaining. The solution was then easily passed through a 0.45 micrometer filter with >90% of the solids content passing the filter to give a yellow, transparent solution.

Example 55

Solubility Testing Examples: Applicable to any Film from Examples 1-43:

A piece of film with the formulation 50ODPA//50DDS with a mass of 0.05834 g was added to a vial containing 1.080 mL of N-methylpyrolidinone. The vessel was inerted with nitrogen and capped. The contents were heated at 120° C. for 12 h. The solution after 12 h hours was dark amber in color and no pieces of the film remaining. The solution was then easily passed through a 0.45-micrometer filter with >90% of the solids content passing the filter to give a yellow, transparent solution.

Example 56

Solubility Testing Examples: Applicable to any Film from Examples 1-43:

A piece of film with the formulation 50ODPA//10DDS/40pPD (example 29) with a mass of 0.3100 g was added to a vial containing 5.741 mL of dimethylacetamide. The vessel was inerted with nitrogen and capped. The contents were heated at 120° C. for 12 h. The solution after 12 h was pale yellow in color and a substantial amount of the film remained intact.

Example 57

Using Reactivity Differences to Make Blocky Polymers

On an analytical balance, 0.2657 g (0.903 mmol) of 3,3',4,4'-biphenyltetracarboxylic dianhydride (BPDA) was weighed out to be with in 0.0005 g of desired value and 0.0977 g (0.9032 mmol) of para-phenylenediamine (pPD) was weighed out to be with in 0.0005 g of desired value. The monomers were transferred to a 20 mL scintillation vial. The weigh paper is rinsed with 1.0 mL of dimethylacetamide, ensuring complete transfer of the monomers to the vial. More solvent (2.74 mL of dimethylacetamide) was transferred by volumetric pipette to give a solution of the first pair of monomers of the copolymer. The vial was inerted with nitrogen by flowing nitrogen through the vial for one minute and quickly capping the vial. The sample was then placed on the shaker for 3 hours to form the poly(amic acid).

On an analytical balance, 0.4701 g (0.9032 mmol) of the 2,2-bis[4-(3,4-dicarboxyphenoxy)phenyl]propane dianhydride (BPADA) was weighed out to be within 0.0005 g of desired value and 0.2243 g (0.9032 mmol) of 4,4'-diaminodiphenylsulfone (DDS) was weighed out to be within 0.0005 g of desired value. The monomers were transferred into the 20 mL scintillation vial containing the poly(amic acid) mixture prepared above. The weigh paper was rinsed with 1.0 mL of dimethylacetamide, ensuring complete transfer of the monomers and then 2.74 mL more of the dimethylacetamide was added to give the final reaction mixture. This gave a solution of about 12.5% solids polyimide. The vial was inerted with nitrogen by flowing nitrogen through the vial for one minute and quickly capping the vial. The sample was then placed on the shaker for 12 hours to assure mixing.

Glass slides (Fisherbrand precleaned microscope slides) were cleaned with hexanes. The solution (2.0 mL) was then filtered through a 0.45 micrometer syringe tip filter onto the glass slide. The solution coated glass slide was then placed on a hotplate equipped with a ramp and soak temperature controller, a cover, and a controlled nitrogen purge of 85 liters (3 cubic feet) per hour (apparatus volume of 0.1 cubic feet). The sample was then imidized using the thermal profile in Table 7.

TABLE 7

| temp ° C. | time (min) |
| --- | --- |
| 25 | 0 |
| 40 | 45 |
| 40 | 60 |
| 120 | 90 |
| 120 | 120 |
| 160 | 150 |
| 160 | 165 |
| 200 | 180 |
| 200 | 195 |
| 300 | 210 |

Following imidization the film was released from the glass slide by immersion in water at 25° C., yielding a freestanding polyimide film. The film was then submitted for testing and analysis.

Example 58

Using Kinetics and Process Parameters to Make Block Co-Polymers.
Two Vessel Method.

On an analytical balance, 0.0892 g (0.3033 mmol) of 3,3',4,4'-biphenyltetracarboxylic dianhydride (BPDA) was weighed out to be within 0.0005 g of desired value and 0.0328 g (0.3033 mmol) of m-phenylenediamine (MPD) was weighed out to be within 0.0005 g of desired value. The monomers were transferred to a 20 mL scintillation vial (Vial#1). The weigh paper was rinsed with 2.0 mL of dimethylacetamide, ensuring complete transfer of the monomers to Vial #1. More solvent (1.0 mL of dimethylacetamide) was transferred by volumetric pipette to give a solution of the first pair of monomers of the copolymer. The vial was inerted with nitrogen by flowing nitrogen through the vial for one minute and quickly capping the vial. The sample was then placed on the shaker for 24 hours to form the poly(amic acid).

On an analytical balance, 0.6314 g (1.2130 mmol) of the 2,2-bis[4-(3,4-dicarboxyphenoxy)phenyl]propane dianhydride (BPADA) was weighed out to be within 0.0005 g of desired value and 0.3012 g (1.2130 mmol) of 4,4'-diaminodiphenylsulfone (DDS) was weighed out to be within 0.0005 g of desired value. The monomers were transferred into a second 20 mL scintillation vial (Vial#2). The weigh paper was rinsed with 1.0 mL of dimethylacetamide, ensuring complete transfer of the monomers. More solvent (3.47 mL of dimethylacetamide) was transferred by volumetric pipette to give a solution of the second pair of monomers of the copolymer. The vial was inerted with nitrogen by flowing nitrogen through the vial for one minute and quickly capping the vial. The sample was then placed on the shaker for 24 hours to form the poly(amic acid).

After mixing, the contents of Vial #2 was added to Vial#1 and rinsed with 2 mL of dimethylacetamide to ensure complete transfer. The vial was inerted with nitrogen by flowing nitrogen through the vial for one minute and quickly capping the vial. The vial was placed on the shaker for 30 minutes. This gave a solution of about 12.5% solids polyimide copolymer.

Glass slides (Fisherbrand precleaned microscope slides) were cleaned with hexanes. The solution (2.0 mL) was then filtered through a 0.45-micrometer syringe tip filter onto the glass slide. The solution coated glass slide was then placed on a hotplate equipped with a ramp and soak temperature controller, a cover, and controlled nitrogen purge of 85 liters (3 cubic feet) per hour (apparatus volume of 0.1 cubic feet). The sample was then imidized using the thermal profile in Table 8.

TABLE 8

| temp ° C. | time (min) |
| --- | --- |
| 25 | 0 |
| 40 | 45 |
| 40 | 60 |
| 120 | 90 |
| 120 | 120 |
| 160 | 150 |
| 160 | 165 |
| 200 | 180 |
| 200 | 195 |
| 300 | 210 |

Example 59

Using Preformed Imide Polymers and Process to Make Block Co-Polymers. Two Vessel Method.

On an analytical balance, 0.6894 g (0.9408 mmol) of Ultem®6050 (homopolymer of BPADA and DDS) was weighed out to be within 0.0005 g of desired value, the polymer was transferred to a 20 mL scintillation vial (Vial#1). The weigh paper was rinsed with 2.0 mL of dimethylacetamide, ensuring complete transfer of the monomers to the vial. More solvent (2.74 mL of dimethylacetamide) was transferred by volumetric pipette to give a solution of the polymer. The vial was inerted with nitrogen by flowing nitrogen through the vial for one minute and quickly capping the vial. The sample was then placed on the shaker for 12 hours.

On an analytical balance, 0.2782 g (0.8967 mmol) of the 4,4'-oxydiphthalic dianhydride (ODPA) was weighed out to be within 0.0005 g of desired value and 0.0970 g (0.8967 mmol) of p-phenylenediamine (PPD) was weighed out to be within 0.0005 g of desired value. The monomers were transferred into a second 20 mL scintillation vial (Vial#2). The weigh paper was rinsed with 2.0 mL of dimethylacetamide, ensuring complete transfer of the monomers. More solvent (1.74 mL of dimethylacetamide) was transferred by volumetric pipette to give a solution of the second pair of monomers of the copolymer. The vial was inerted with nitrogen by flowing nitrogen through the vial for one minute and quickly capping the vial. The sample was then placed on the shaker for 12 hours to form the poly(amic acid).

After mixing, the contents of Vial #2 was added to Vial#1 and rinsed with 1 mL of dimethylacetamide to ensure complete transfer to Vial #2. The vial was inerted with nitrogen by flowing nitrogen through the vial for one minute and quickly capping the vial. The vial was placed on the shaker for 6 hours. This gave a solution of about 12.5% solids polyimide copolymer.

Glass slides (Fisherbrand precleaned microscope slides) were cleaned with hexanes. The solution (2.0 mL) was then filtered through a 0.45-micrometer syringe tip filter onto the glass slide. The solution coated glass slide was then placed on a hotplate equipped with a ramp and soak temperature controller, a cover, and controlled nitrogen purge of 3 cubic feet per hour (apparatus volume of 0.1 cubic feet). The sample was then imidized using the thermal profile in Table 9.

TABLE 9

| temp ° C. | time (min) |
| --- | --- |
| 25 | 0 |
| 40 | 45 |
| 40 | 60 |
| 120 | 90 |
| 120 | 120 |
| 160 | 150 |
| 160 | 165 |
| 200 | 180 |
| 200 | 195 |
| 300 | 210 |

Following imidization the film was released from the glass slide by immersion in water at 25° C., yielding a freestanding polyimide film. The film was then submitted for testing and analysis.

Example 60

Using Preformed Imide Prepolymer or Polymer and Process to Make Random Co-Polymers, Ambient Temperature Method:

On an analytical balance, 0.9255 g (1.2630 mmol) of Ultem®6050 (homopolymer of BPADA and DDS) was weighed out to be within 0.0005 g of desired value and 0.0326 g (0.3018 mmol) of m-phenylenediamine (MPD) was weighed out to be within 0.0005 g of desired value. The polymer and diamine were transferred to a 20 mL scintillation vial (Vial#1). The weigh paper was rinsed with 2.0 mL of dimethylacetamide, ensuring complete transfer of the monomers. Water (0.01 mL) and more solvent (4.98 mL of dimethylacetamide) were transferred by volumetric pipette to give a solution of the polymer and diamine and water. The vial was inerted with nitrogen by flowing nitrogen through the vial for one minute and quickly capping the vial. The sample was then placed on the shaker for 24 hours. (The mixture can optionally be heated at this point to about 50° C. while shaking to aid the randomization reaction).

After the 24 hours, 0.0936 g (0.3018 mmol) of the 4,4'-oxydiphthalic dianhydride (ODPA) was weighed out to be within 0.0005 g of desired value. The dianhydride was transferred into the 20 mL scintillation vial (Vial#1). The weigh paper was rinsed with 1.49 mL of dimethylacetamide, ensuring complete transfer of the monomer. The vial was inerted with nitrogen by flowing nitrogen through the vial for one minute and quickly capping the vial. The sample was then placed on the shaker for 12 hours to form the random poly (amic acid). This gave a solution of about 12.5% solids polyimide copolymer.

Glass slides (Fisherbrand precleaned microscope slides) were cleaned with hexanes. The solution (2.0 mL) was then filtered through a 0.45 micrometer syringe tip filter onto the glass slide. The solution coated glass slide was then placed on a hotplate equipped with a ramp and soak temperature controller, a cover, and controlled nitrogen purge of 85 liters (3 cubic feet) per hour (apparatus volume of 0.1 cubic feet). The sample was then imidized using the thermal profile.

Following imidization the film was released from the glass slide by immersion in water at 25° C., yielding a freestanding polyimide film. The film was then submitted for testing and analysis.

Examples 61-85

Examples 61-85 Listed in Table 11 were Prepared According to the Method Described for Examples 1-43.

Casting Procedure: The correct mol ratios of dianhydride and diamine as shown in Table 11 were weighed on an analytical balance to four decimal place accuracy.

TABLE 11

| | | Dianhydrides | | | | | | Diamines | | | | | |
|---|---|---|---|---|---|---|---|---|---|---|---|---|---|
| Ex. | Solvent | ODPA (%) | BPDA (%) | BTDA (%) | BPhDA (%) | PMDA (%) | BPADA (%) | DDS (%) | PPD (%) | 133APB (%) | 134APB (%) | MPD (%) | ODA (%) |
| 61 | DMAc | 50 | 0 | 0 | 0 | 0 | 0 | 50 | 0 | 0 | 0 | 0 | 0 |
| 62 | DMAc | 45 | 0 | 5 | 0 | 0 | 0 | 50 | 0 | 0 | 0 | 0 | 0 |
| 63 | DMAc | 5 | 0 | 45 | 0 | 0 | 0 | 50 | 0 | 0 | 0 | 0 | 0 |
| 64 | NMP | 45 | 0 | 0 | 5 | 0 | 0 | 50 | 0 | 0 | 0 | 0 | 0 |
| 65 | NMP | 0 | 0 | 45 | 5 | 0 | 0 | 50 | 0 | 0 | 0 | 0 | 0 |
| 66 | DMAc | 45 | 0 | 0 | 5 | 0 | 0 | 50 | 0 | 0 | 0 | 0 | 0 |
| 67 | DMAc | 50 | 0 | 0 | 0 | 0 | 0 | 50 | 0 | 0 | 0 | 0 | 0 |
| 68 | DMAc | 50 | 0 | 0 | 0 | 0 | 0 | 40 | 0 | 0 | 0 | 10 | 0 |
| 69 | DMAc | 50 | 0 | 0 | 0 | 0 | 0 | 40 | 10 | 0 | 0 | 0 | 0 |
| 70 | DMAc | 50 | 0 | 0 | 0 | 0 | 0 | 40 | 0 | 0 | 0 | 0 | 10 |
| 71 | DMAc | 50 | 0 | 0 | 0 | 0 | 0 | 10 | 0 | 0 | 0 | 40 | 0 |
| 72 | DMAc | 50 | 0 | 0 | 0 | 0 | 0 | 10 | 40 | 0 | 0 | 0 | 0 |
| 73 | DMAc | 50 | 0 | 0 | 0 | 0 | 0 | 10 | 0 | 0 | 0 | 0 | 40 |
| 74 | DMAc | 50 | 0 | 0 | 0 | 0 | 0 | 40 | 0 | 0 | 10 | 0 | 0 |
| 75 | DMAc | 50 | 0 | 0 | 0 | 0 | 0 | 10 | 0 | 0 | 40 | 0 | 0 |
| 76 | DMAc | 50 | 0 | 0 | 0 | 0 | 0 | 5 | 45 | 0 | 0 | 0 | 0 |
| 77 | DMAc | 45 | 5 | 0 | 0 | 0 | 0 | 50 | 0 | 0 | 0 | 0 | 0 |
| 78 | DMAc | 45 | 5 | 0 | 0 | 0 | 0 | 10 | 40 | 0 | 0 | 0 | 0 |
| 79 | DMAc | 40 | 0 | 10 | 0 | 0 | 0 | 50 | 0 | 0 | 0 | 0 | 0 |
| 80 | DMAc | 0 | 0 | 0 | 0 | 0 | 50 | 50 | 0 | 0 | 0 | 0 | 0 |
| 81 | DMAc | 50 | 0 | 0 | 0 | 0 | 0 | 45 | 5 | 0 | 0 | 0 | 0 |
| 82 | DMAc | 50 | 0 | 0 | 0 | 0 | 0 | 25 | 25 | 0 | 0 | 0 | 0 |
| 83 | DMAc | 45 | 5 | 0 | 0 | 0 | 0 | 30 | 20 | 0 | 0 | 0 | 0 |
| 84 | DMAc | 45 | 5 | 0 | 0 | 0 | 0 | 30 | 20 | 0 | 0 | 0 | 0 |
| 85 | DMAc/NMP | 50 | 0 | 0 | 0 | 0 | 0 | 50 | 0 | 0 | 0 | 0 | 0 |

The monomers were then transferred to a scintillation vial and the weigh paper used was rinsed with the solvent. The remaining volume of solvent was transferred to the vial and the vial was rendered inert with nitrogen. The sealed inert vial was then placed on a shaker overnight to produce a poly(amic acid) solution. The poly(amic acid) solution is then drop cast through a 0.45-micrometer filter onto clean glass slides, prepared in advance by cleaning with hexanes.

The coated slides were then placed on a hotplate equipped with: a thermocouple; a ramp and soak temperature controller; a nitrogen purge; and, a cover. The films were then imidized following the heating profile outlined in FIG. 1 and Table 2.

Upon completion of the imidization reaction, the films so produced were removed from the glass slide for use in later examples, or for thorough property testing. The physical property measurements for Examples 61-85 are listed in Table 12.

TABLE 10

| temp ° C. | time (min) |
|---|---|
| 25 | 0 |
| 40 | 45 |
| 40 | 60 |
| 120 | 90 |
| 120 | 120 |
| 160 | 150 |
| 160 | 165 |
| 200 | 180 |
| 200 | 195 |
| 300 | 210 |

TABLE 12

| Ex. | Solvent | Tg (DSC) Run 1 | Run 2 | CTE (ppm/° C.) | Tg (DMA) (° C.) | Metal Adhesion | Equilib moisture (%) | Moisture absorption (%) |
|---|---|---|---|---|---|---|---|---|
| 61 | DMAc | 302 | | 42 | 318 | | | |
| 62 | DMAc | 340 | 314 | 45 | 323 | | | |
| 63 | DMAc | 292 | 327 | 50 | 334 | | | |
| 64 | NMP | 343 | | | | | | |
| 65 | NMP | 312 | | 42 | 326 | | | |
| 66 | DMAc | 293 | | 41/44 | 307 | 3 | 1 | 2.2 |
| 67 | DMAc | 319 | | 47 | 324 | 5 | 1.5 | 3.3 |
| 68 | DMAc | 298 | | 48 | | | | |
| 69 | DMAc | 301 | | 47 | 311 | | | |
| 70 | DMAc | 278 | | 48 | | | | |
| 71 | DMAc | 294 | | 43 | | | | |
| 73 | DMAc | 343 | | | | | | |
| 75 | DMAc | 214 | | 48 | 217 | | | |
| 76 | DMAc | 298 | | 19 | | | | |
| 77 | DMAc | 213 | | 51 | | | | |
| 78 | DMAc | 243, 295 | 226, 310 | 46 | | | | |
| 79 | DMAc | 231, 303, 340 | | 45 | | | | |
| 80 | DMAc | 248 | | 52 | | | | |
| 81 | DMAc | | | 47 | | | | |
| 82 | DMAc | | | 44 | | | | |
| 83 | DMAc | | | 42 | | | | |
| 84 | DMAc | | | 36 | | | | |
| 85 | DMAc/NMP | 294 | | | | | | |

Example 86

FPC Example

On an analytical balance, 11.3387 g of 4,4'-oxydiphthalic anhydride, 1.8151 g of diaminodiphenylsulfone and 3.1620 g of para-phenylene diamine were weighed out to be with in 0.0005 g of the desired weight. The monomers were transferred to a 100 mL vial, rinsing the weigh paper with 2.0 mL of dimethylacetamide, to ensure complete transfer of the monomers. The remaining solvent (55.63 mL of dimethylacetamide) was transferred by volumetric pipette to give a solution of 12.5 weight % solids. The vial was rendered inert by flowing nitrogen through the vial for one minute and then quickly capping the vial. The sample was then placed on the shaker overnight to form a poly(amic acid) solution.

Using a syringe and a 0.45 micrometer filter, 5 mL of solution was then transferred onto a piece of smooth metallic copper foil 10.2 centimeters×20.4 centimeters, 50.8 micrometers thick (4 inch×8 inch, and 2 mil thick) pre-cleaned with isopropanol and drawn into a thin uniform coating using a 381 micrometer (15 mil) wet film applicator. The sample was then imidized using the thermal profile outline described above for examples 1-43 and detailed in Tables 2 and FIG. 1 giving a polyimide/copper laminate.

The laminate was then masked with scotch tape to give a pattern of exposed copper lines of varying width (from 1 mm to 5 mm). The exposed copper was then etched with concentrated nitric acid for one minute followed by washing with deionized water yielding a patterned laminate with discrete copper conductors.

Example 87

Wire Wrap Example #1

A film was prepared from the composition 45% 4,4'-oxydiphthalic anhydride, 5% 3,3',4,4'-biphenyltetracarboxylic dianhydride and 50% diaminodiphenylsulfone prepared as above. The film was cut into strips 1 mm wide and 5 cm in length. The strip of film was affixed to a 16 gauge stainless steel wire at a 45 degree angle relative to the wire with a piece of tape. The stripped was then tightly wrapped with 0.1 mm overlap at the edge to provide a high heat, flexible, insulating coating around the wire.

Example 88

Capacitor

A 7.62 centimeter×7.62 centimeter (3"×3") piece of film (prepared from the composition 40% 4,4'-oxydiphthalic anhydride, 10% 3,3',4,4'-biphenyltetracarboxylic dianhydride and 10% para-phenylene diamine and 40% 4,4'-diaminodiphenylsulfone, as above using a 381 micrometer (15 mil) doctor blade) was placed between to pieces of 5.08 centimeters×5.08 centimeters (2"×2") copper foil. The stack was then pressed between the parallel plates of a heated press at 404° C. (760° F.) for one minute with three tons of pressure on the hydraulic ram. The resultant article, which has an adhesion ranking of 4 by the test described previously, is a capacitor consisting of two parallel conductors separated by thin polyimide insulator.

All patents, patent applications, and other publications disclosed herein are incorporated by reference in their entirety as though set forth in full.

While the invention has been described with reference to preferred embodiment, it will be understood by those skilled in the art that various changes may be made, and equivalents substituted, for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out the present invention, but that the invention will include all embodiments falling within the scope of the appended claims.

We claim:

1. A solvent cast film, comprising:
   a thermoplastic polyimide comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and a combination thereof, with a diamine component comprising 4,4'-diaminodiphenylsulfone and p-phenylene diamine and wherein the diamine component comprises greater than or equal to 10 mole % of 4,4'-diaminodiphenyl sulfone, based on the total moles of the diamine component;

wherein the polyimide has a glass transition temperature from 190° C. to 400° C.; and wherein the film is solvent cast and has
- a coefficient of thermal expansion of less than 30 ppm/° C. as measured over 30 to 200° C.,
- a thickness from 0.1 to 250 micrometers, and
- less than 5% residual solvent by weight.

2. The film of claim 1, wherein the dianhydride component further comprises a dianhydride selected from the group consisting of:

2,2'-bis(1,3-trifluoromethyl-4-phenyl)-3,3',4,4'-biphenyltetracarboxylic dianhydride
2,2'-bis(1-methyl-4-phenyl)-3,3',4,4'-biphenyltetracarboxylic dianhydride;
2,2'-bis(1-phenyl-4-phenyl)-3,3',4,4'-biphenyltetracarboxylic dianhydride;
2,2'-bis(1-trifluoromethyl-2-phenyl)-3,3',4,4'-biphenyltetracarboxylic dianhydride;
2,2'-bis(1-trifluoromethyl-3-phenyl)-3,3',4,4'-biphenyltetracarboxylic dianhydride;
2,2'-bis(1-trifluoromethyl-4-phenyl)-3,3',4,4'-biphenyltetracarboxylic dianhydride;
2,2'-bis(3,4-dicarboxyphenyl)hexafluoropropane dianhydride;
2,2-bis((4-(3,3-dicarboxyphenoxy)phenyl)hexafluoropropane dianhydride;
2,2-bis((4-(3,3-dicarboxyphenoxy)phenyl)propane dianhydride;
2,2-bis[4-(2,3-dicarboxyphenoxy)phenyl]propane dianhydride;
2,2-bis[4-(3,4-dicarboxyphenoxy)phenyl]propane dianhydride;
2,2'-dibromo-3,3',4,4'-biphenyltetracarboxylic dianhydride;
2,3,6,7-naphthalic dianhydride;
3,3',4,4'-benzophenonetetracarboxylic dianhydride;
3,3',4,4'-biphenylethertetracarboxylic dianhydride;
3,3',4,4'-biphenylsulphonictetracarboxylic dianhydride;
3,3',4,4'-biphenyltetracarboxylic dianhydride;
3,3',4,4'-dimethyldiphenylsilane tetracarboxylic dianhydride;
3,3',4,4'-diphenylmethane tetracarboxylic dianhydride;
3,3',4,4'-diphenylsulfide tetracarboxylic dianhydride;
3,3',4,4'-diphenylsulfone tetracarboxylic dianhydride;
3,3',4,4'-diphenylsulfoxide tetracarboxylic dianhydride;
3,3'-benzophenone tetracarboxylic dianhydride;
4-(2,3-dicarboxyphenoxy)-4'-(3,4-dicarboxyphenoxy)benzophenone dianhydride;
4-(2,3-dicarboxyphenoxy)-4'-(3,4-dicarboxyphenoxy)diphenylether dianhydride;
4-(2,3-dicarboxyphenoxy)-4'-(3,4-dicarboxyphenoxy)diphenylsulfide dianhydride;
4-(2,3-dicarboxyphenoxy)-4'-(3,4-dicarboxyphenoxy)diphenylsulfone dianhydride;
4-(2,3-dicarboxyphenoxy)-4'-(3,4-dicarboxyphenoxy)diphenyl-2,2-propane dianhydride;
4,4'-bis(2,3-dicarboxyphenoxy)benzophenone dianhydride;
4,4'-bis(2,3-dicarboxyphenoxy)diphenylether dianhydride;
4,4'-bis(2,3-dicarboxyphenoxy)diphenylsulfide dianhydride;
4,4'-bis(2,3-dicarboxyphenoxy)diphenylsulfone dianhydride;
4,4'-bis(3,4-dicarboxyphenoxy)diphenylpropane dianhydride;
4,4'-bis(3,4-dicarboxyphenoxy)diphenylsulfide dianhydride;
4,4'-bis(3,4-dicarboxyphenoxy)diphenylsulphone dianhydride;
4,4'-bis(3,4-dicarboxyphenoxy)benzophenone dianhydride;
4,4'-bis(3,4-dicarboxyphenoxy)diphenylether dianhydride;
4,4'-bis(3,4-dicarboxyphenoxy)diphenylsulfide dianhydride;
4,4'-bis(3,4-dicarboxyphenoxy)diphenylsulfone dianhydride;
4,4'-bisphenol A dianhydride;
4,4'-carbonyldiphtalic dianhydride
6,6'-bis(3,4-dicarboxyphenoxy)-2,2',3,3'-tetrahydro-3,3,3',3'-tetramethyl-1,1'-spirobi[1H-indene]dianhydride;
7,7'-bis(3,4-dicarboxyphenoxy)-3,3',4,4'-tetrahydro-4,4,4',4'-tetramethyl-2,2'-spirobi[2H-1-benzopyran]dianhydride;
bis(phthalic)phenylsulphineoxide dianhydride;
bis(triphenylphthalic)-4,4'-diphenylether dianhydride;
bis(triphenylphthalic)-4,4'-diphenylmethane dianhydride;
hydroquinone diphtalic dianhydride;
m-phenylene-bis(triphenylphthalic)dianhydride;
p-phenylene-bis(triphenylphthalic)dianhydride;
pyromellitic dianhydride;
(3,3',4,4'-diphenyl)phenylphosphinetetracarboxylic dianhydride;
(3,3',4,4'-diphenyl)phenylphosphineoxidetetracarboxylic dianhydride;
1,3-bis(2,3-dicarboxyphenoxy)benzene dianhydride;
1,3-bis(3,4-dicarboxyphenoxy)benzene dianhydride;
1,4-bis(2,3-dicarboxyphenoxy)benzene dianhydride;
1,4-bis(3,4-dicarboxyphenoxy)benzene dianhydride; and a combination thereof.

3. The film of claim 1, wherein the diamine component further comprises a diamine selected from the group consisting of:

1,5-diaminonaphthalene;
2,2',3,3'-tetrahydro-3,3,3',3'-tetramethyl-1,1'-spirobi[1H-indene]-6,6'-diamine;
2,4-diaminotoluene;
2,6-diaminotoluene;
3,3',4,4'-tetrahydro-4,4,4',4'-tetramethyl-2,2'-spirobi[2H-1-benzopyran]-7,7'-diamine;
3,3'-dimethoxybenzidine;
3,3'-dimethylbenzidine;
4,4'-diaminodiphenylether(4,4'-oxydianiline);
4,4'-diaminodiphenylsulfide;
4,4'-diaminodiphenylmethane(4,4'-methylenedianiline);
4,4'-diaminodiphenylpropane;
benzidine;
bis(4-aminophenyl)ether;
bis(4-aminophenyl)sulfide;
bis(4-aminophenyl)methane;
bis(4-aminophenyl)propane;
m-phenylenediamine;

m-xylylenediamine;
;
p-xylylenediamine; and
a combination thereof.

4. The film of claim 1, wherein the diamine component further comprises a diamine selected from the group consisting of m-phenylenediamine, 4,4'-oxydianiline, 1,3-bis(4-aminophenoxy)benzene, 1,3-bis(3-aminophenoxy)benzene, and a combination thereof.

5. The film of claim 1, wherein the solvent comprises N,N-dimethylacetamide, N,N-dimethylformamide, N-methylpyrrolidinone, dimethylsulfoxide, sulfolane, tetrahydrofuran, benzophenone, cyclohexanone, phenol, o-cresol, p-cresol, m-cresol, phenol, ethylphenol, isopropylphenol, t-butylphenol, xylenol, mesitol, chlorophenol, dichlorophenol, phenylphenol, a monoalkyl ether of ethylene glycol having from 1 to about 4 carbon atoms in the alkyl group, a monoalkyl ether of diethylene glycol having from 1 to about 4 carbon atoms in the alkyl group, a monoaryl ether glycol, a monoaryl ether of propylene glycol, tetramethylurea, phenoxy ethanol, propylene glycol phenyl ether, anisole, veratrole, o-dichlorobenzene, chlorobenzene, trichloroethane, methylene chloride, chloroform, pyridine, N-cyclohexylpyrrolidinone, ethyl lactate, an ionic liquid or a combination thereof.

6. The film of claim 1, wherein the film further comprises a nanoclay.

7. The film of claim 6, wherein the film has a lower CTE than a film of the same composition without the nanoclay.

8. The film of claim 6, wherein the film has a Tg that is the same as a film of the same composition without the nanoclay.

9. The film of claim 6, wherein the film is transparent.

10. The film of claim 1, wherein the film has a coefficient of thermal expansion of at least 5 ppm/° C. as measured over 30 to 200° C.

11. The film of claim 1, wherein the film has a coefficient of thermal expansion from 10 to 30 ppm/° C. as measured over 30 to 200° C.

12. The film of claim 1, wherein the film has a coefficient of thermal expansion from 10 to 20 ppm/° C. as measured over 30 to 200° C.

13. The film of claim 1, wherein the film has a coefficient of thermal expansion that is within ±20 ppm/° C. (as measured over 30 to 200° C.) of the coefficient of thermal expansion of copper, silicon, aluminum, gold, silver, nickel, a glass, a ceramic, or a polymer.

14. The film of claim 1, wherein the film has a coefficient of thermal expansion that is within ±15 ppm/° C. (as measured over 30 to 200° C.) of the coefficient of thermal expansion of copper.

15. The film of claim 1, wherein the film loses less than 5% of its initial weight after storage in water for 24 hours at 25° C.

16. The film of claim 1, wherein the film loses less than 2% of its initial weight after storage in water for 24 hours at 25° C.

17. The film of claim 1, wherein the film is a dry film, and a 10 wt % solution of the dried film in dimethylacetamide or N-methylpyrrolidinone has an inherent viscosity that is greater than 0.05 dl/g.

18. The film of claim 1, wherein after lamination to a substrate at a temperature from 250° C. to 450° C., the coefficient of thermal expansion of the laminated film is within ±10 ppm/° C. (as measured over 30 to 200° C.) of the coefficient of thermal expansion of the film prior to lamination.

19. The film of claim 1, wherein the film is cast from a composition comprising 1 to 30 wt % solids.

20. The film of claim 1, further comprising up to 50 wt % of a recycled polyimide film comprising structural units derived from the dianhydride component and a diamine component, wherein prior to recycling the polyimide has a glass transition temperature from 210° C. to 450° C.; and the film has a coefficient of thermal expansion of less than 30 ppm/° C. as measured over 30 to 200° C., a thickness from 1 to 250 micrometers, and less than 5% residual solvent by weight.

21. The film of claim 1, wherein the film further comprises up to 30 wt % of a recycled polyimide film comprising structural units derived from the dianhydride component and a diamine component, wherein prior to recycling the polyimide has a glass transition temperature from 210° C. to 450° C.; and the film has a coefficient of thermal expansion of less than 30 ppm/° C. as measured over 30 to 200° C., a thickness from 1 to 250 micrometers, and less than 5% residual solvent by weight.

22. The film of claim 20, wherein the coefficient of thermal expansion of the film comprising the recycled polyimide film is within 10 ppm/° C. (as measured over 30 to 200° C.) of the coefficient of thermal expansion of the film without the recycled polyimide film.

23. A composition comprising a recycled polyimide film of claim 1.

24. The composition of claim 23, wherein the recycled polyimide film is capable of being melt blended.

25. A method of making a solvent cast polyimide film, comprising:
casting a polyamic acid composition comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and a combination thereof, with a diamine component comprising 4,4'-diaminodiphenylsulfone and p-phenylene diamine and wherein the diamine component comprises greater than or equal to 10 mole % of 4,4'-diaminodiphenyl sulfone, based on the total moles of the diamine component onto a substrate to form a film;
heating the cast film for a time and at a temperature effective to remove the solvent and to form a solvent cast polyimide film having a coefficient of thermal expansion of less than 60 ppm/° C. as measured over 30 to 200° C., and a thickness from 0.1 to 125 micrometers; and
processing the solvent cast polyimide film to reduce the coefficient of thermal expansion of the film to below 35 ppm/° C. (as measured over 30 to 200° C.) by biaxially stretching the solvent cast polyimide film.

26. The method of claim 25, wherein the solvent cast polyimide film comprises a nanoclay.

27. The method of claim 26, wherein the nanoclay is an exfoliated nanoclay.

28. The method of claim 27, wherein exfoliating is carried out in a composition comprising 10-90% by weight of the nano-clay and 10-90% by weight of the solvent system.

29. The method of claim 26, wherein the nanoclay is added to the polyamic acid composition after the polyamic acid composition is formed.

30. The method of claim 26, further comprising reacting a dianhydride component and an organic diamine component in a solvent system to form the polyamic acid composition before casting the polyamic acid composition.

31. The method of claim 30, comprising reacting the dianhydride component and the organic diamine component in the presence of the nanoclay.

32. The method of claim 30, further comprising exfoliating the nanoclay in the solvent system prior to reacting the dianhydride component and the organic diamine component in the solvent system.

33. An article comprising the film of claim 1.

34. The article of claim 33, wherein the film is disposed on a first substrate.

35. The article of claim 34, wherein the first substrate is selected from the group consisting of copper, silicon, aluminum, gold, silver, nickel, a glass, a ceramic, and a polymer.

36. The article of claim 35, wherein the polymer is a solvent cast polyimide film comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, with a diamine component;
wherein the polyimide has a glass transition temperature of at least 190° C.;
wherein the film is solvent cast and has
a coefficient of thermal expansion of less than 30 ppm/° C. as measured over 30 to 200° C.,
a thickness from 0.1 to 250 micrometers, and
less than 5% residual solvent by weight;
wherein the polyimide has less than 15 molar % of structural units derived from a member selected from the group consisting of biphenyltetracarboxylic acid, a dianhydride of biphenyltetracarboxylic acid, an ester of biphenyltetracarboxylic acid, and a combination thereof.

37. The article of claim 34, further comprising a second substrate disposed on a side of the film opposite the first substrate.

38. The article of claim 37, wherein the second substrate is selected from the group consisting of copper, silicon, aluminum, gold, silver, nickel, glass, ceramic, a polymer, and a combination thereof.

39. The article of claim 38, wherein the polymer is a solvent cast polyimide film comprising structural units derived from polymerization of a dianhydride component comprising a dianhydride selected from the group consisting of 3,4'-oxydiphthalic dianhydride, 3,3'-oxydiphthalic dianhydride, 4,4'-oxydiphthalic dianhydride, and combinations thereof, with a diamine component;
wherein the polyimide has a glass transition temperature of at least 190° C.;
wherein the film is solvent cast and has
a coefficient of thermal expansion of less than 60 ppm/° C. as measured over 30 to 200° C.,
a thickness from 0.1 to 250 micrometers, and
less than 5% residual solvent by weight;
wherein the polyimide has less than 15 molar % of structural units derived from a member selected from the group consisting of biphenyltetracarboxylic acid, a dianhydride of biphenyltetracarboxylic acid, an ester of biphenyltetracarboxylic acid, and a combination thereof.

40. A solvent cast film, comprising:
a thermoplastic polyetherimide comprising structural units derived from the polymerization of a dianhydride component comprising a dianhydride selected from the group consisting 3,4'-oxydiphthalic dianhydride, 3,3'-oxydiphthalic dianhydride, 4,4'-oxydiphthalic dianhydride, and combinations thereof, with a diamine component comprising 4,4'-diaminodiphenylsulfone and p-phenylene diamine, wherein the diamine component comprises greater than or equal to 10 mole % of 4,4'-diaminodiphenyl sulfone, based on the total moles of the diamine component;
wherein the polyimide has a glass transition temperature from 190° C. to 400° C.;
wherein the film is solvent cast and has
a coefficient of thermal expansion of less than 60 ppm/° C. as measured over a temperature of 30 to 200° C.,
a thickness from 0.1 to 250 micrometers, and
less than 5% residual solvent by weight;
wherein the film has a coefficient of thermal expansion that is within ±20 ppm/° C. of the coefficient of thermal expansion of copper, silicon, aluminum, gold, silver, nickel, a glass, a ceramic, or a polymer; and
wherein the solvent is selected from the group consisting of N,N-dimethylacetamide, N,N-dimethylformamide, N-methylpyrrolidinone, dimethylsulfoxide, sulfolane, tetrahydrofuran, benzophenone, cyclohexanone, phenol, o-cresol, p-cresol, m-cresol, phenol, ethylphenol, isopropylphenol, t-butylphenol, xylenol, mesitol, chlorophenol, dichlorophenol, phenylphenol, a monoalkyl ether of ethylene glycol having from 1 to about 4 carbon atoms in the alkyl group, a monoalkyl ether of diethylene glycol having from 1 to about 4 carbon atoms in the alkyl group, a monoaryl ether glycol, a monoaryl ether of propylene glycol, tetramethylurea, phenoxy ethanol, propylene glycol phenyl ether, anisole, veratrole, o-dichlorobenzene, chlorobenzene, trichloroethane, methylene chloride, chloroform, pyridine, N-cyclohexylpyrrolidinone, ethyl lactate, an ionic liquid, and a combination comprising at least two of the foregoing solvents.

41. A solvent cast film comprising
a thermoplastic polyetherimide comprising structural units derived from polymerization of 4,4'-oxydiphthalic dianhydride, p-phenylene diamine and 4,4'-diaminodiphenylsulfone;
wherein the polyimide has a glass transition temperature from 190° C. to 400° C.;
wherein the film is solvent cast and has
a coefficient of thermal expansion of less than 30 ppm/° C. as measured over a temperature of 30 to 200° C.,
a thickness from 0.1 to 250 micrometers, and
less than 5% residual solvent by weight; and
wherein the film has less than 15 molar % of biphenyltetracarboxylic acid or its dianhydride or its ester.

42. A method of manufacture of a recycled polyimide composition, comprising
melting the solvent cast polyimide film of claim 1; and
combining the melted solvent cast polyimide film of claim 1 with a polymer composition to form a recycled a polyimide composition.

43. The method of claim 42, further comprising extruding the composition comprising the melted film.

44. A method of manufacture of a recycled a polyimide composition, comprising
dissolving the solvent cast polyimide film of claim 1; and
combining the dissolved film of claim 1 with a polymer composition to form the recycled polyimide composition.

45. The method of claim 44, further comprising extruding the recycled polyimide composition.

46. An article comprising the recycled polyimide composition of claim 42.

47. An article comprising the recycled polyimide composition of claim 44.

* * * * *